United States Patent [19]

Somekh et al.

[11] Patent Number: 5,643,366
[45] Date of Patent: Jul. 1, 1997

[54] WAFER HANDLING WITHIN A VACUUM CHAMBER USING VACUUM

[75] Inventors: Sasson R. Somekh, Los Altos Hills; Philip M. Salzman, San Jose; Oskar U. Vierny, Palo Alto, all of Calif.

[73] Assignee: Applied Materials, Inc., Santa Clara, Calif.

[21] Appl. No.: 189,951

[22] Filed: Jan. 31, 1994

[51] Int. Cl.$^6$ .................................. C23C 16/00
[52] U.S. Cl. .................... 118/721; 118/715; 118/725; 118/728; 414/935
[58] Field of Search ..................... 118/715, 718, 118/724, 725, 728, 729, 935; 156/345; 901/27, 30

[56] References Cited

U.S. PATENT DOCUMENTS

| | | | |
|---|---|---|---|
| 3,599,059 | 8/1971 | Hou | 317/234 R |
| 4,559,718 | 12/1985 | Tadokoro | 34/8 |
| 4,617,844 | 10/1986 | Batten | 81/436 |
| 4,634,043 | 1/1987 | Avedissian | 228/180.2 |
| 4,699,554 | 10/1987 | Kawashima | 414/217 |
| 4,715,637 | 12/1987 | Hosoda | 294/86.4 |
| 4,730,976 | 3/1988 | Davis | 414/749 |
| 4,733,632 | 3/1988 | Ohmi | 118/729 |
| 4,740,135 | 4/1988 | Shulenberger | 414/749 |
| 4,749,330 | 6/1988 | Hine | 414/744 A |
| 4,813,845 | 3/1989 | Swain | 414/744.5 |
| 4,813,846 | 3/1989 | Helms | 414/744.1 |
| 4,842,680 | 6/1989 | Davis | 156/643 |
| 4,848,814 | 7/1989 | Suzuki | 294/1.1 |
| 4,854,263 | 8/1989 | Chang | 118/715 |
| 4,867,859 | 9/1989 | Harada | 204/298 |
| 5,000,113 | 3/1991 | Wang | 118/723 |
| 5,038,711 | 8/1991 | Dan | 118/715 |
| 5,049,029 | 9/1991 | Mitsui | 414/744.5 |
| 5,064,340 | 11/1991 | Genov | 414/744.5 |
| 5,076,207 | 12/1991 | Washitani | 118/725 |
| 5,169,684 | 12/1992 | Takagi | 427/248.1 |
| 5,186,718 | 2/1993 | Tepman | 29/25.01 |
| 5,195,866 | 3/1993 | Hasegawa | 414/749 |
| 5,248,028 | 9/1993 | Weiblen | 198/803.14 |
| 5,268,067 | 12/1993 | Dostalik | 156/643 |
| 5,273,588 | 12/1993 | Foster | 118/723 E |
| 5,286,296 | 2/1994 | Sato | 118/719 |
| 5,292,393 | 3/1994 | Maydan | 156/345 |
| 5,292,554 | 3/1994 | Sinha | 118/725 |
| 5,302,209 | 4/1994 | Maeda | 118/719 |
| 5,314,538 | 5/1994 | Maeda | 118/715 |

(List continued on next page.)

FOREIGN PATENT DOCUMENTS

| | | | |
|---|---|---|---|
| 0276061 | 7/1988 | European Pat. Off. | |
| 61140432 | 4/1983 | Japan | |
| 58-13051 | 8/1983 | Japan | |
| 59-182046 | 10/1984 | Japan | |
| 63-48825 | 3/1986 | Japan | |
| 1194323 | 4/1989 | Japan | |
| 110047 | 4/1990 | Japan | 414/935 |
| 206644 | 7/1992 | Japan | 414/935 |
| 5-339097 | 12/1993 | Japan | |

*Primary Examiner*—Richard Bueker
*Assistant Examiner*—Jeffrie R. Lund
*Attorney, Agent, or Firm*—Janis Biksa

[57] ABSTRACT

A structure and method for handling and processing wafers in a face down configuration is disclosed. A robot insertion blade supports a wafer to be processed in a recess having conically sloping wafer holding surfaces which touch the wafer only at its outer periphery. Once positioned in the chamber, a set of three transfer finger with sloped contact surfaces supported from a "C" shaped support assembly raise the wafer adjacent to a susceptor bottom surface. A recess in the face of the susceptor covering a large portion of the wafer is evacuated, compared to process chamber pressure, and when the differential pressure between the processing chamber and the evacuated recess behind the wafer can support the wafer, the transfer finger supports are lower and rotated out from under the wafer and susceptor assembly. The susceptor with the wafer attached by vacuum is then lowered to a processing location in contact with shadow rings supported by the "C" shaped support assembly and opposite a gas distribution plate.

58 Claims, 16 Drawing Sheets

U.S. PATENT DOCUMENTS

| | | | |
|---|---|---|---|
| 5,326,725 | 7/1994 | Sherstinsky | 437/225 |
| 5,338,363 | 8/1994 | Kawata | 118/725 |
| 5,368,437 | 11/1994 | Kuno | 414/786 |
| 5,445,677 | 8/1995 | Kawata | 118/724 |
| 5,446,824 | 8/1995 | Moslehi | 392/416 |
| 5,489,192 | 2/1996 | Taniguchi | 414/744.2 |

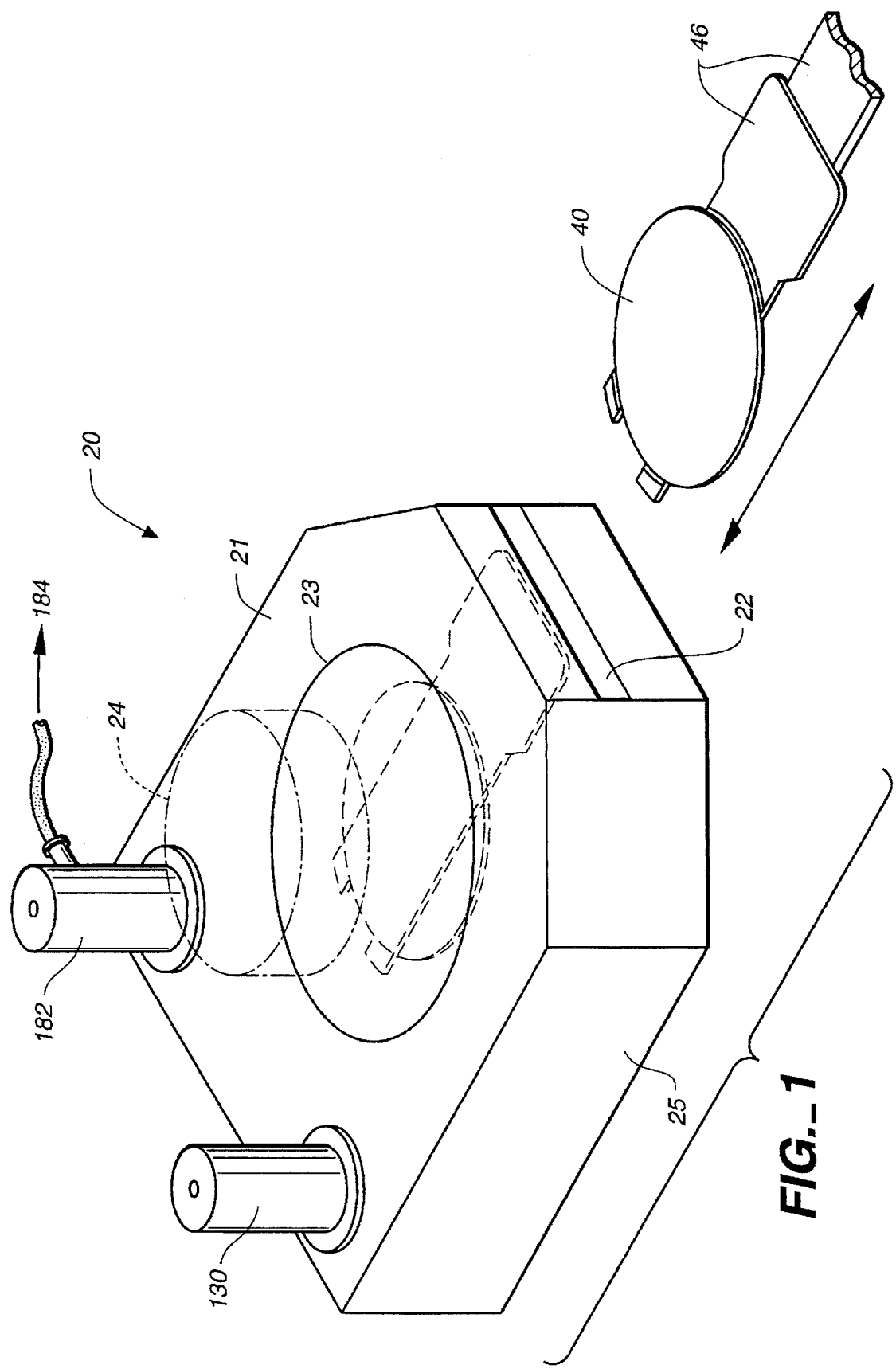

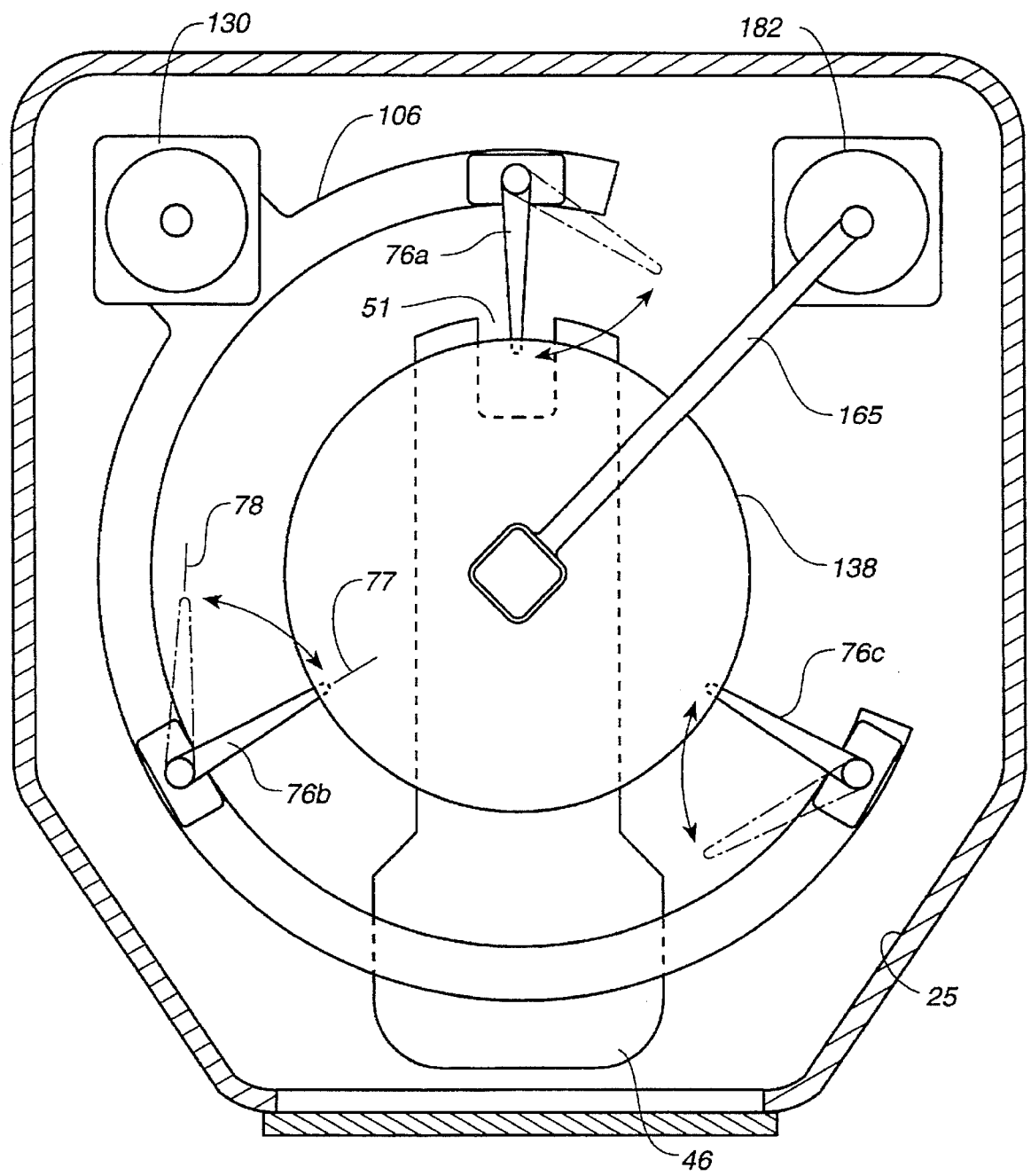
FIG._2

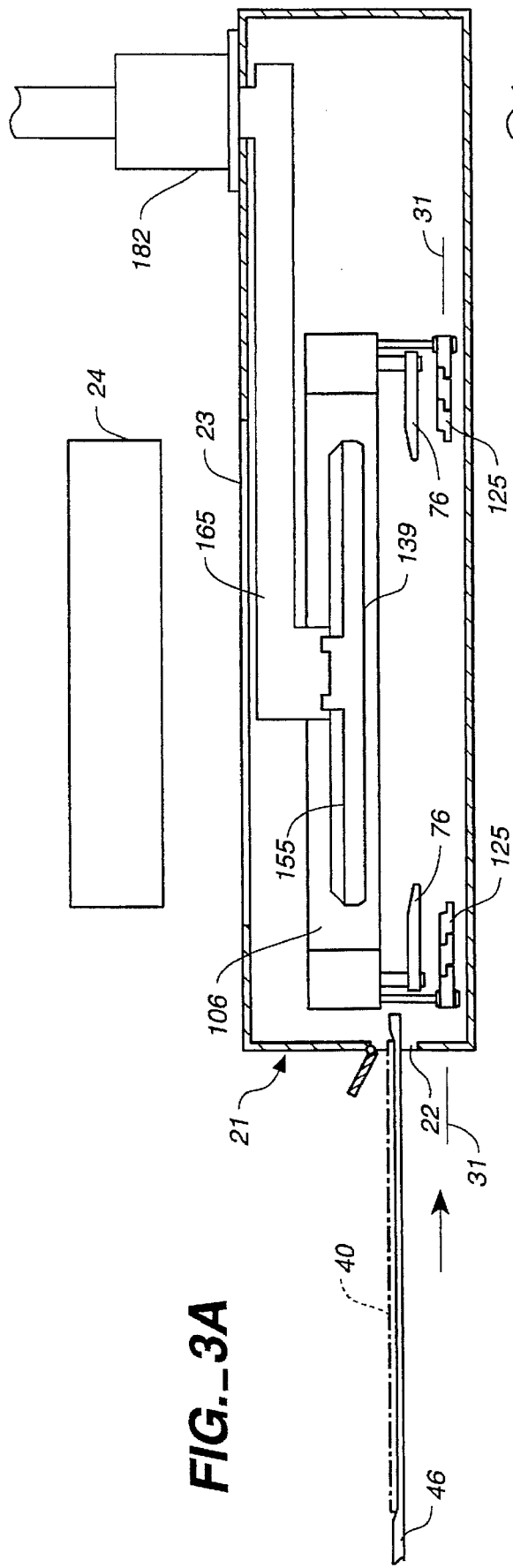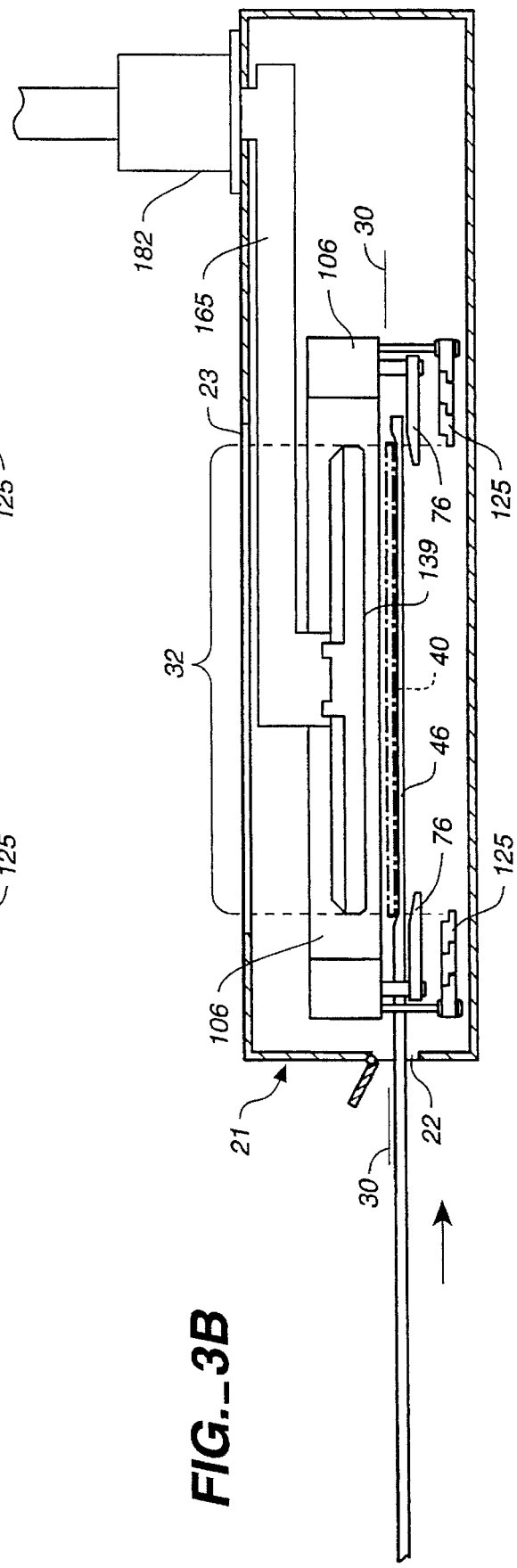

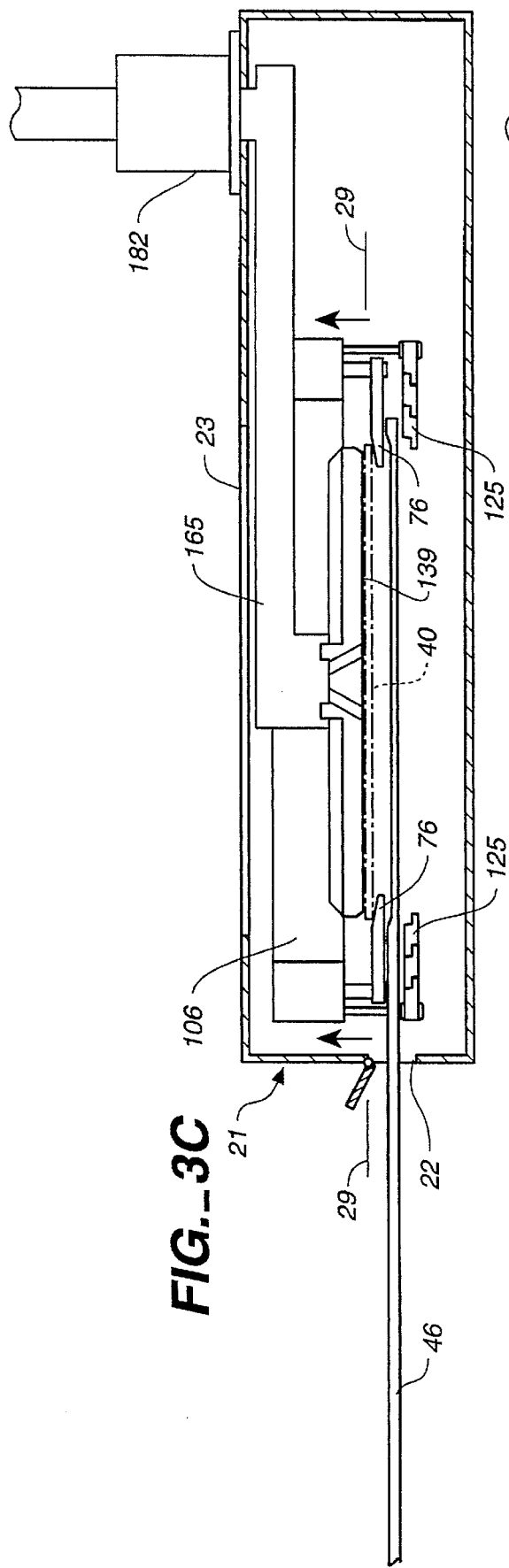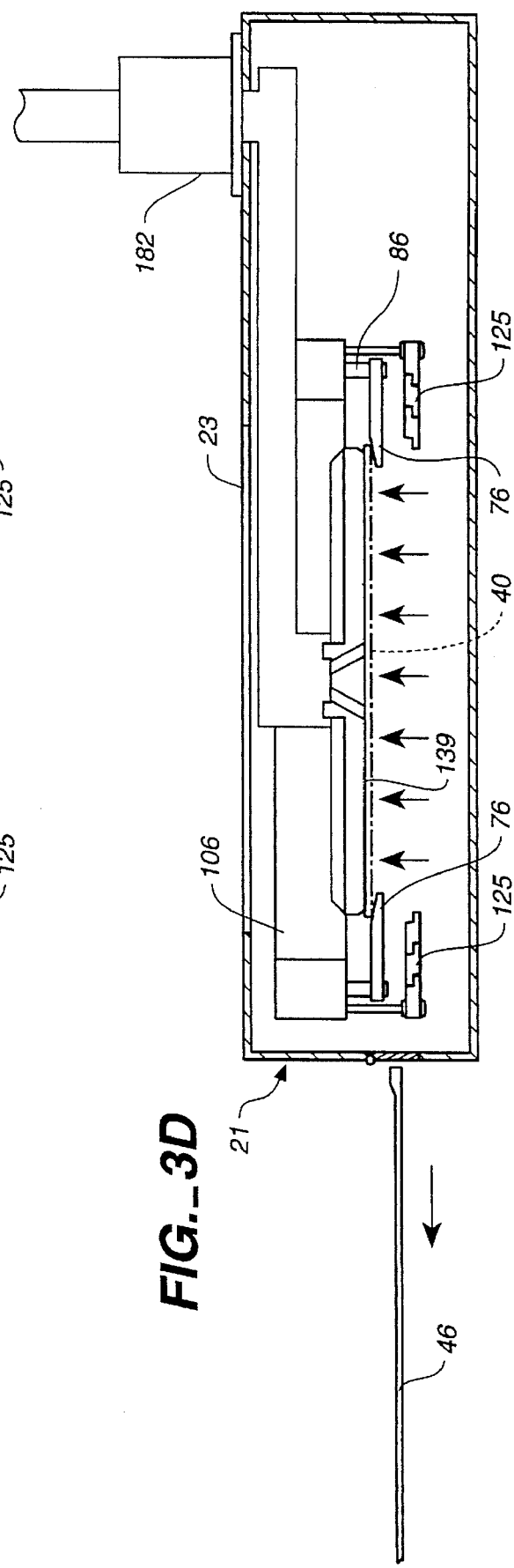

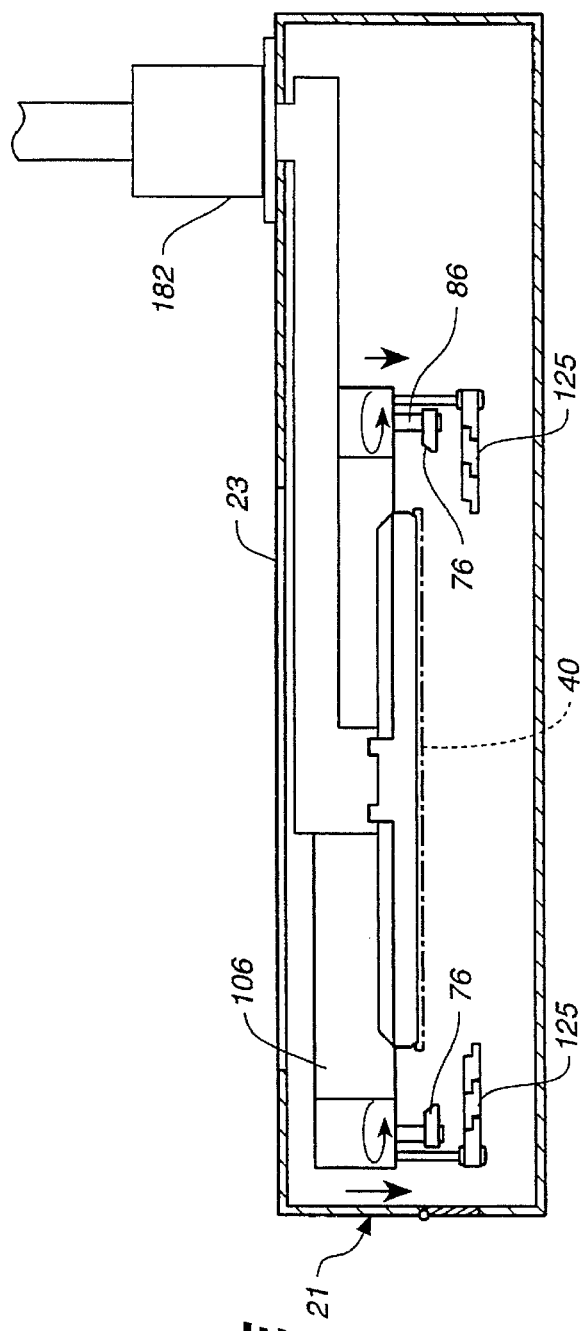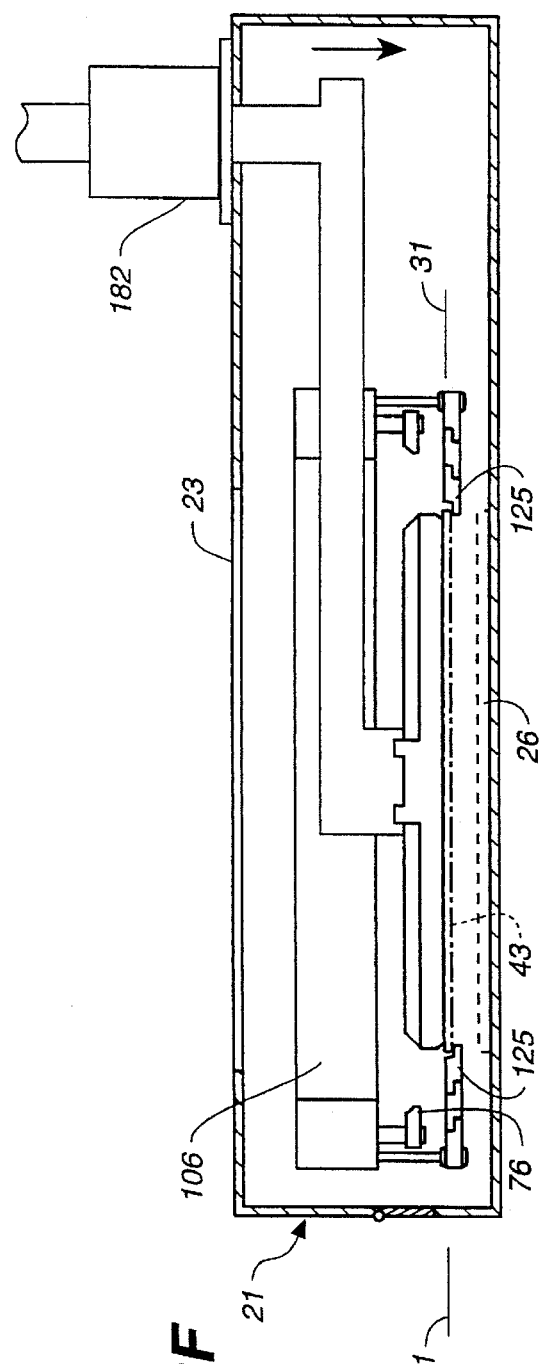

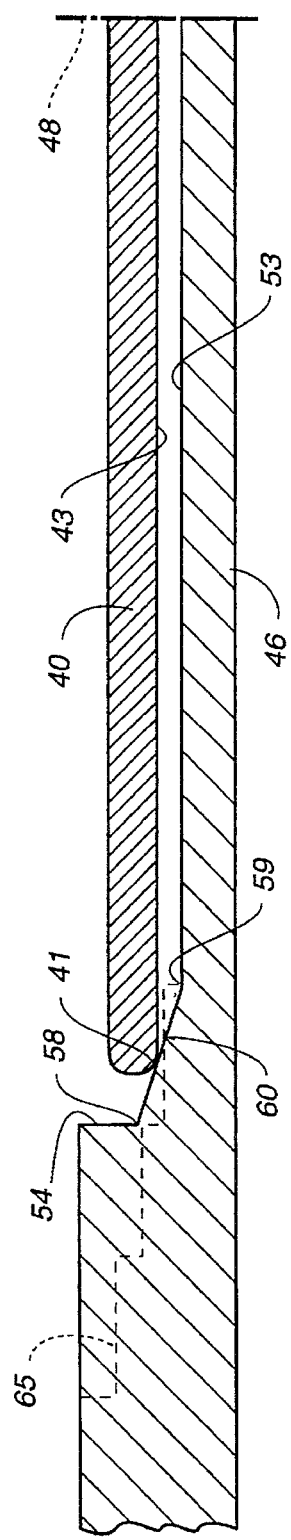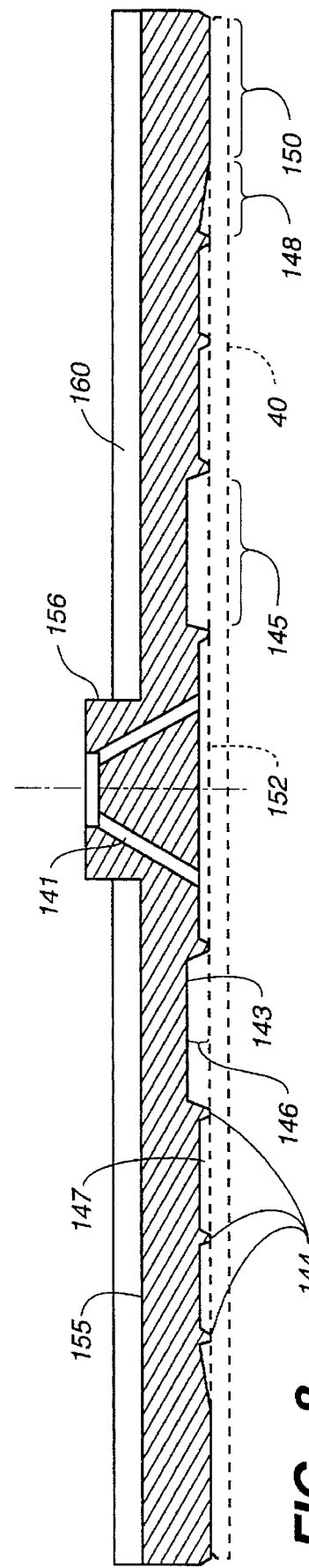

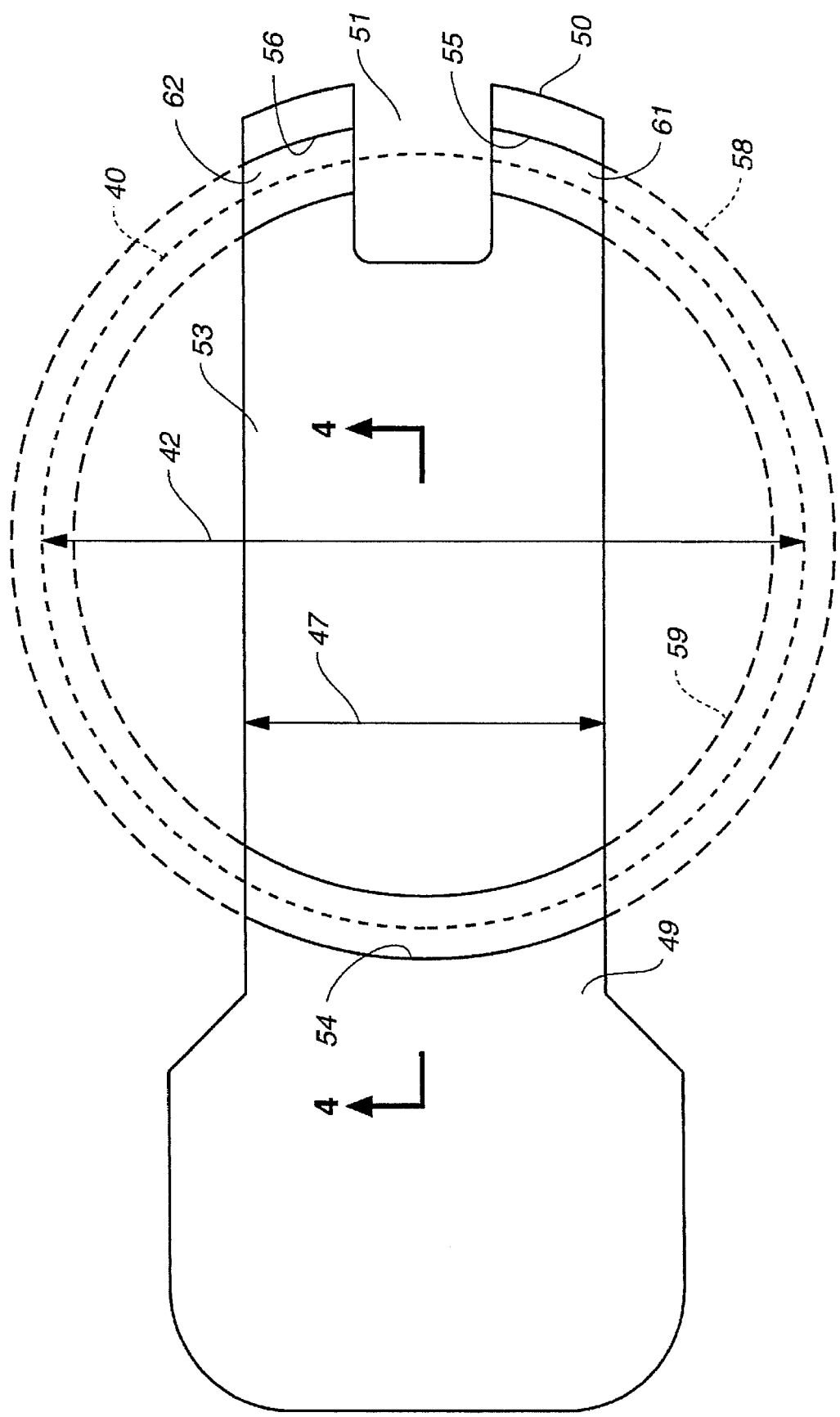
FIG._5

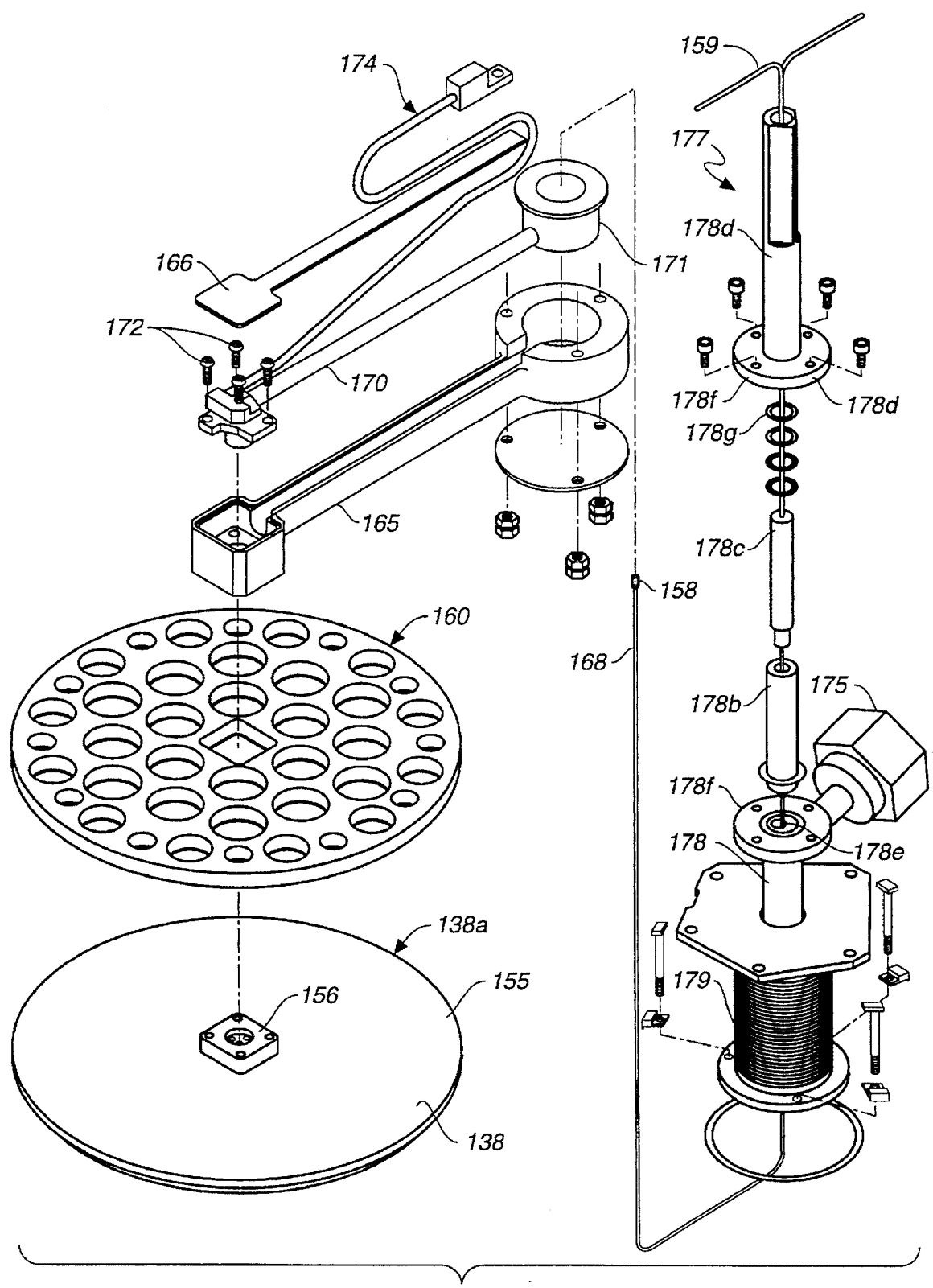
FIG._6

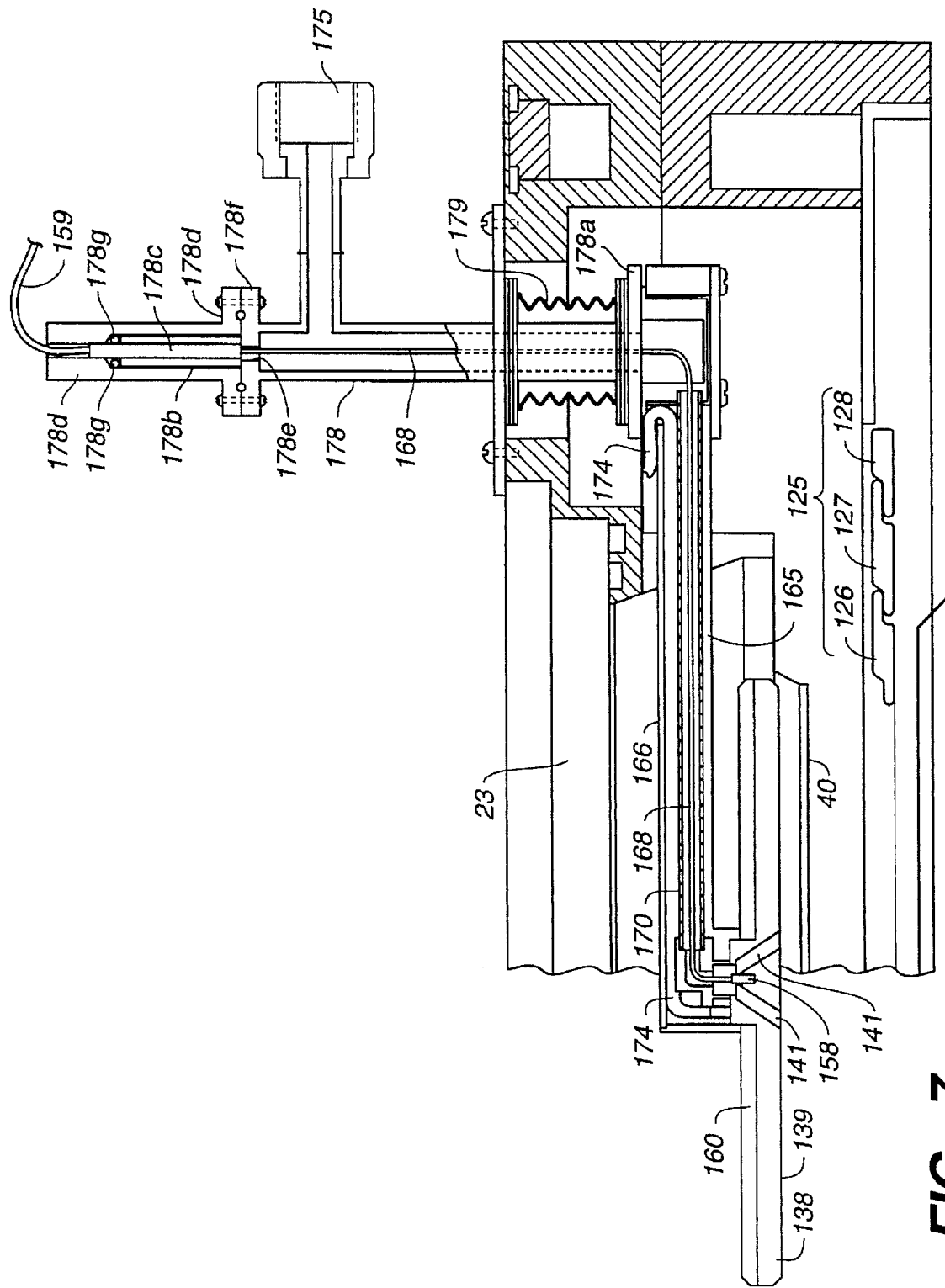
FIG._7

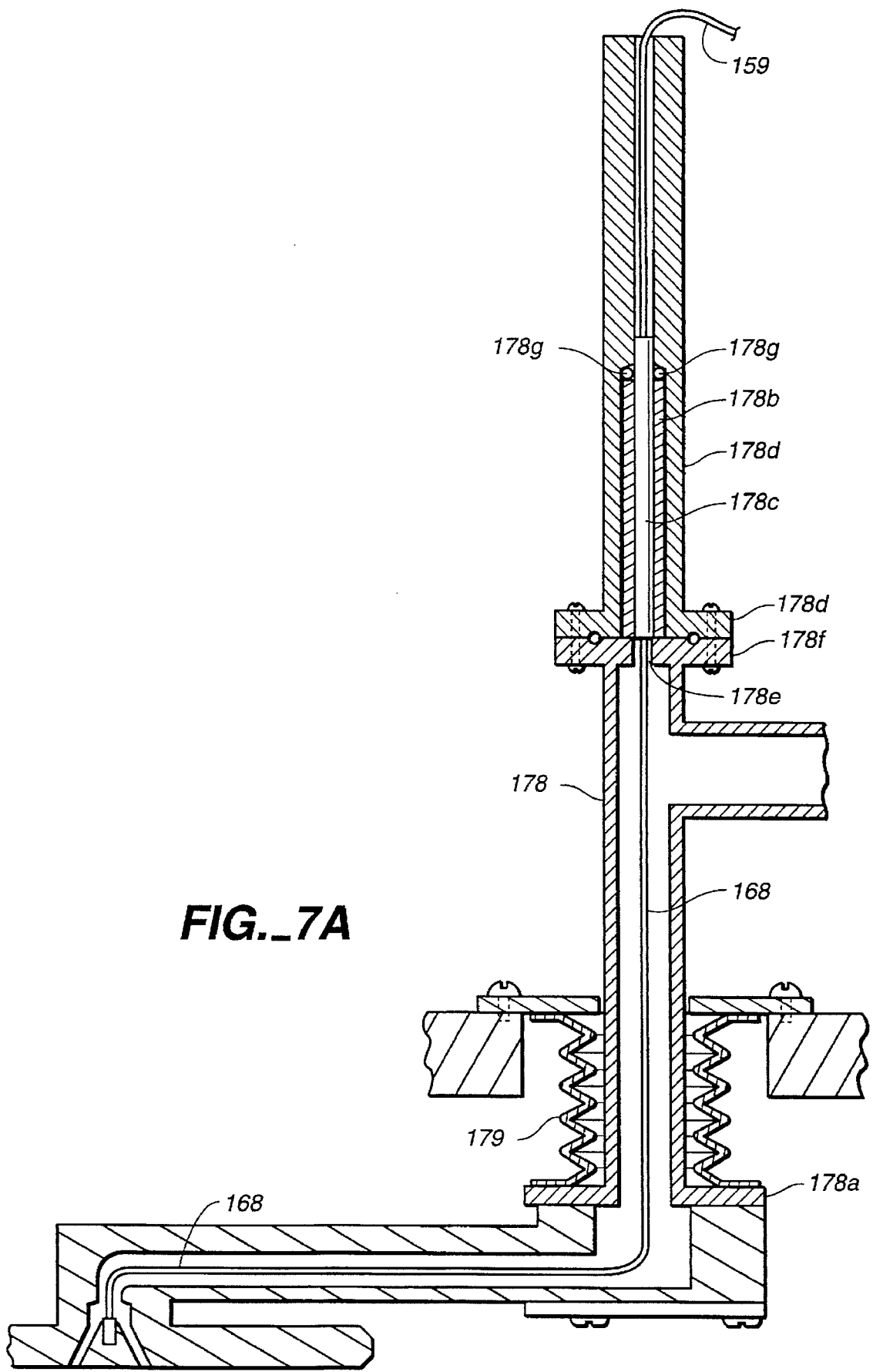
FIG._7A

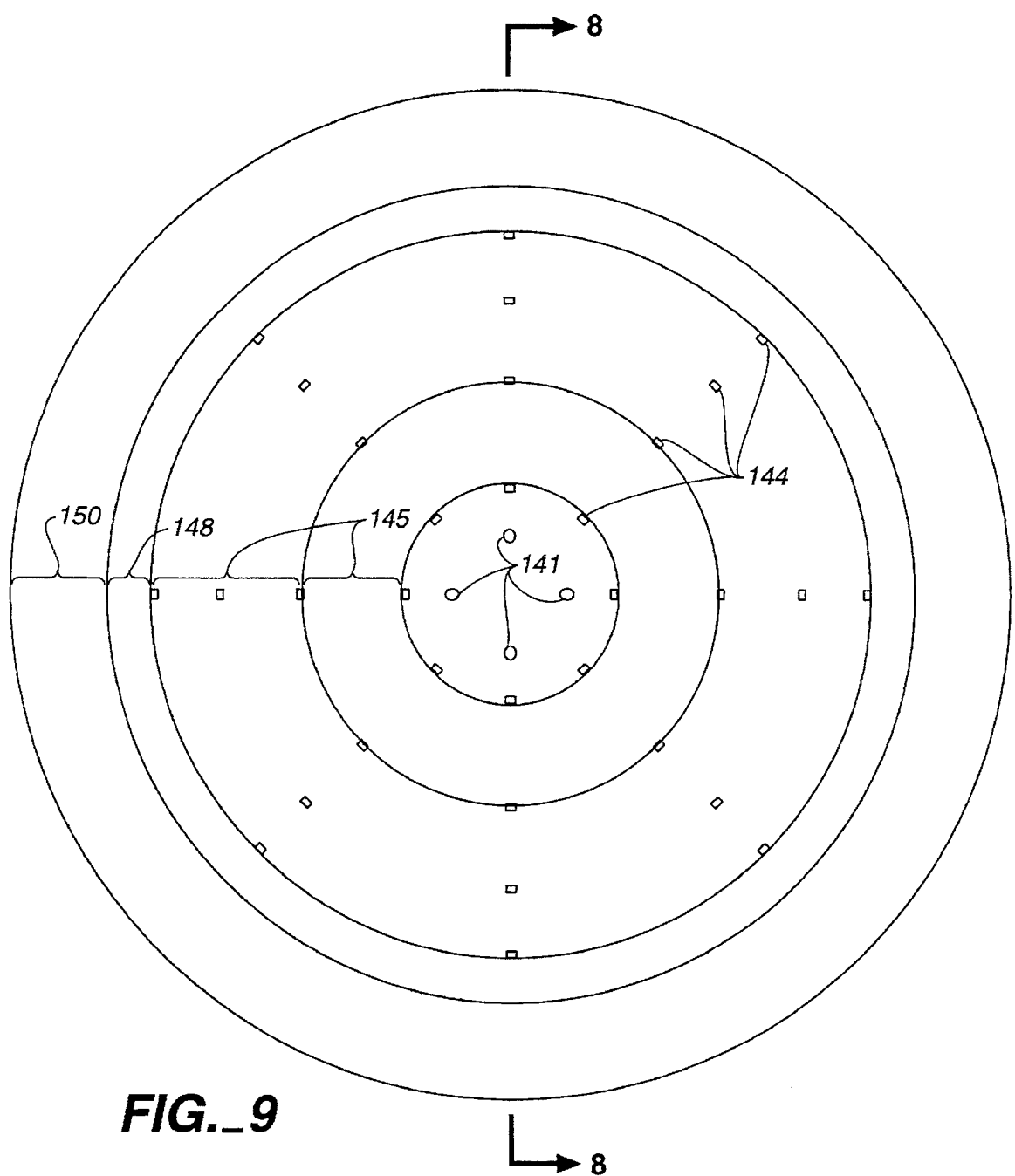
FIG._9

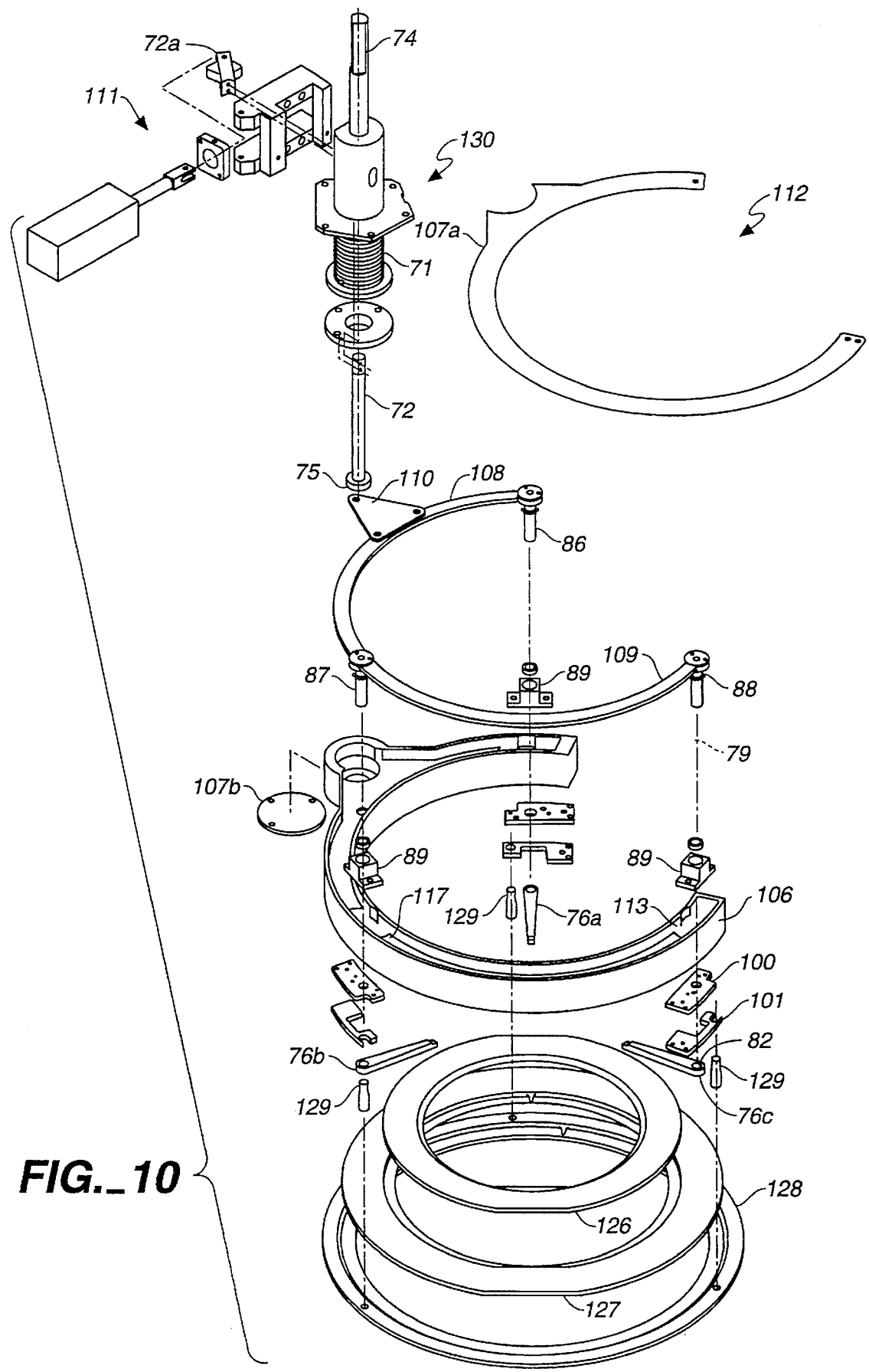
FIG._10

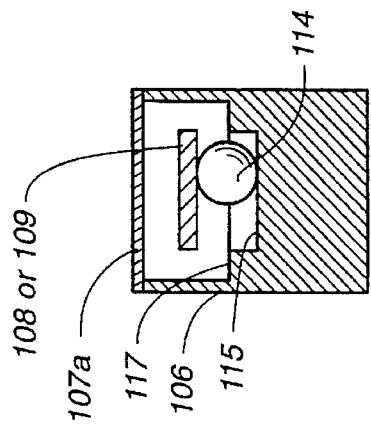
FIG._13
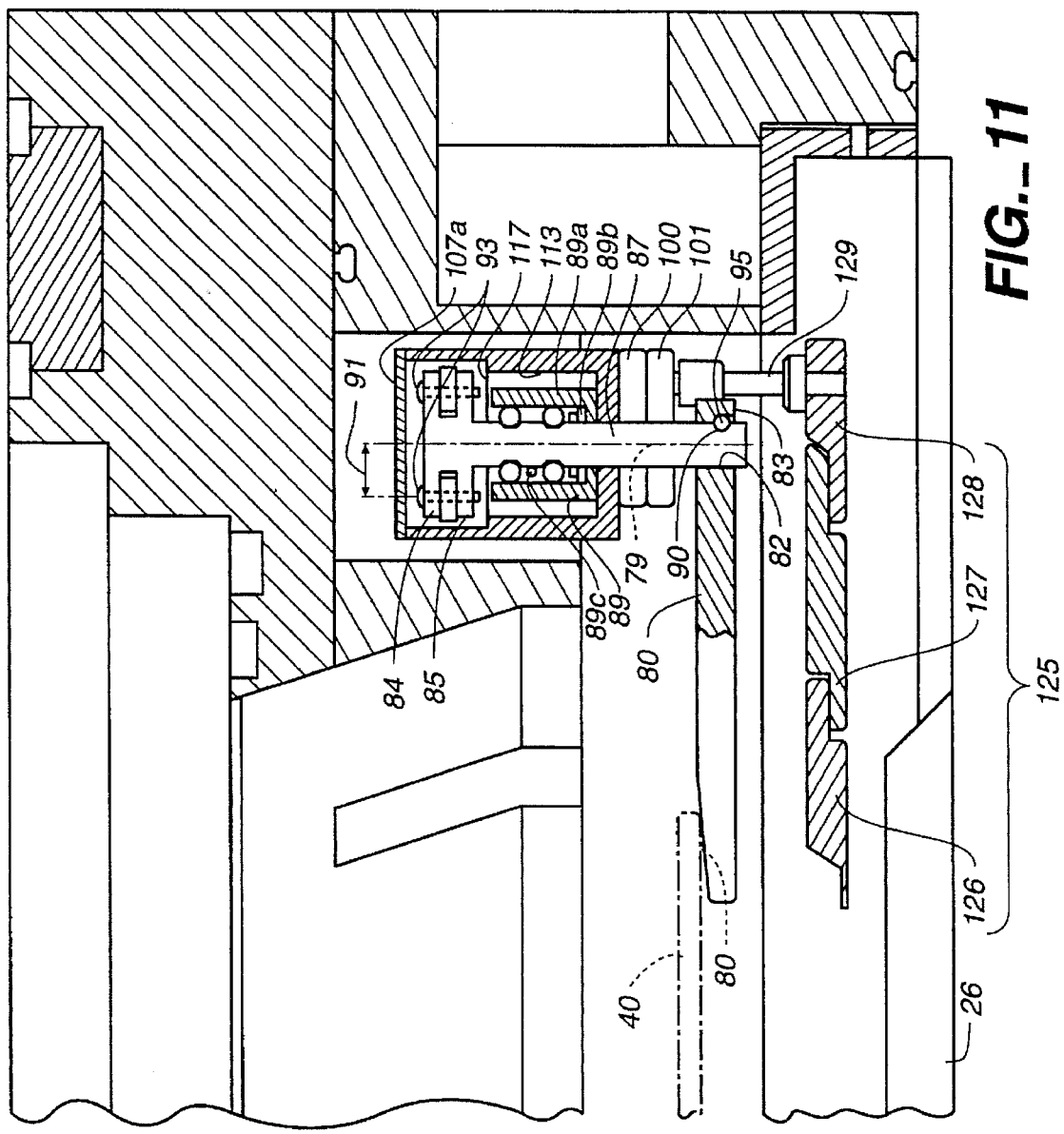
FIG._11

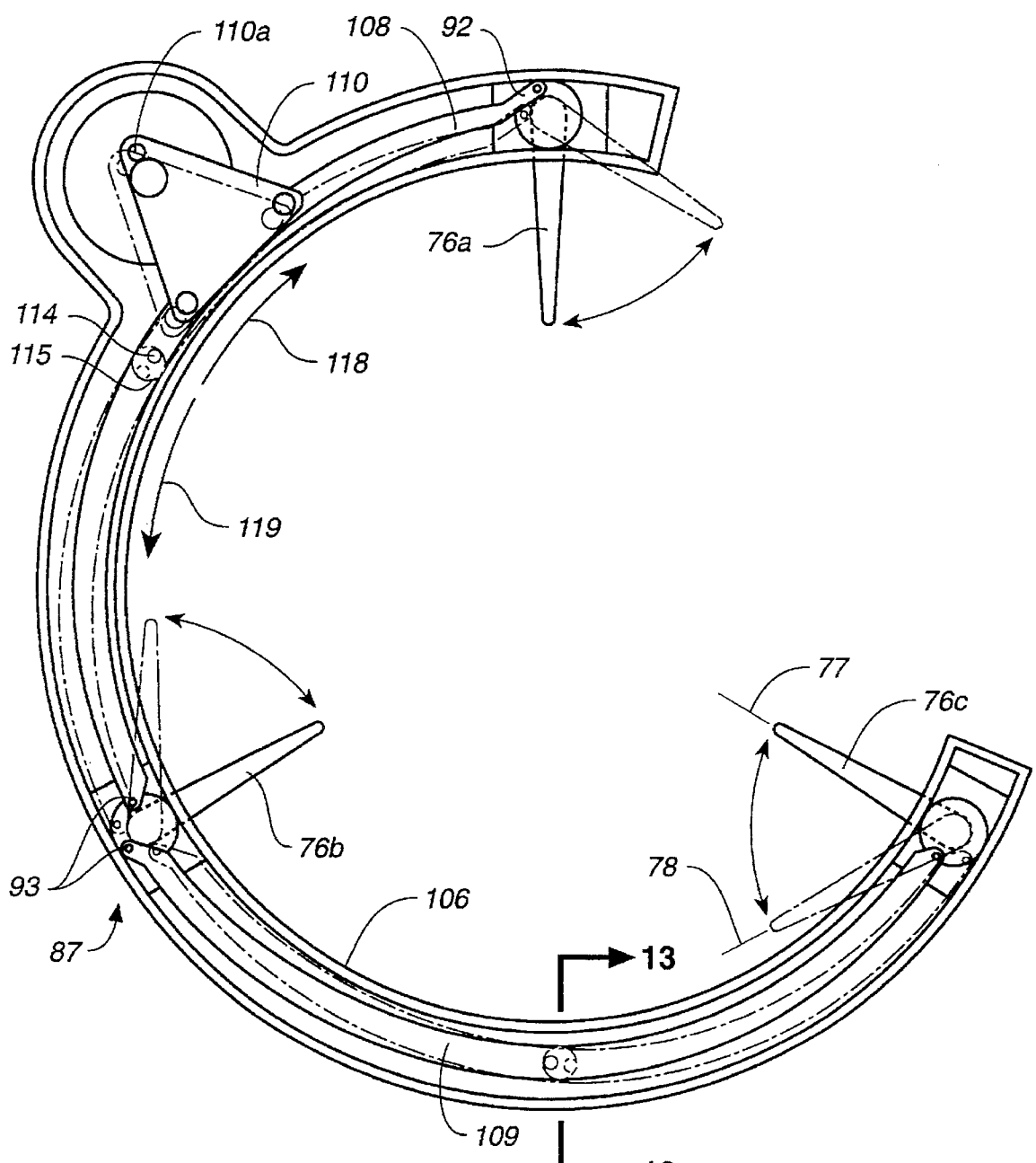
FIG._12

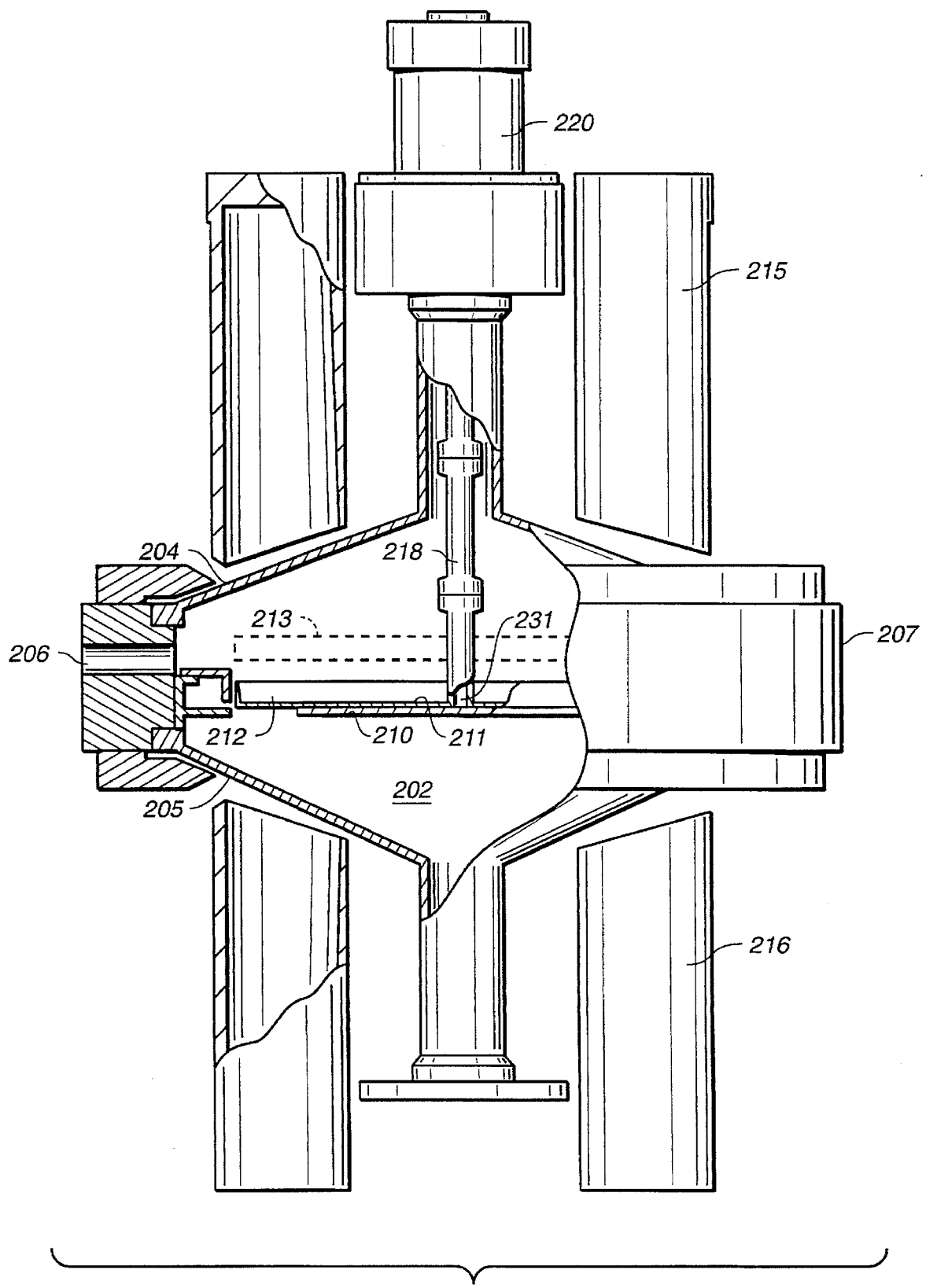
FIG._14

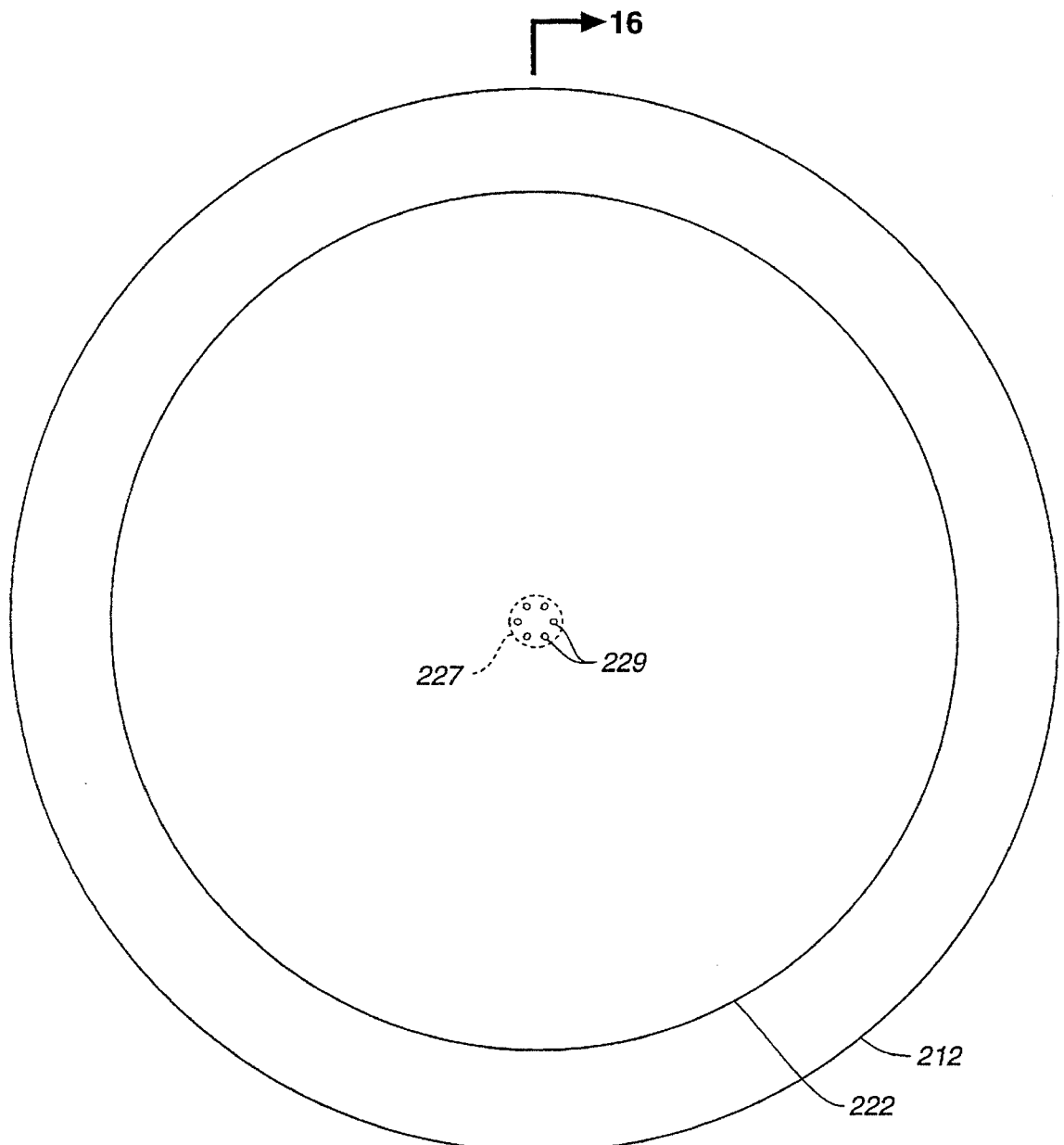
FIG._15
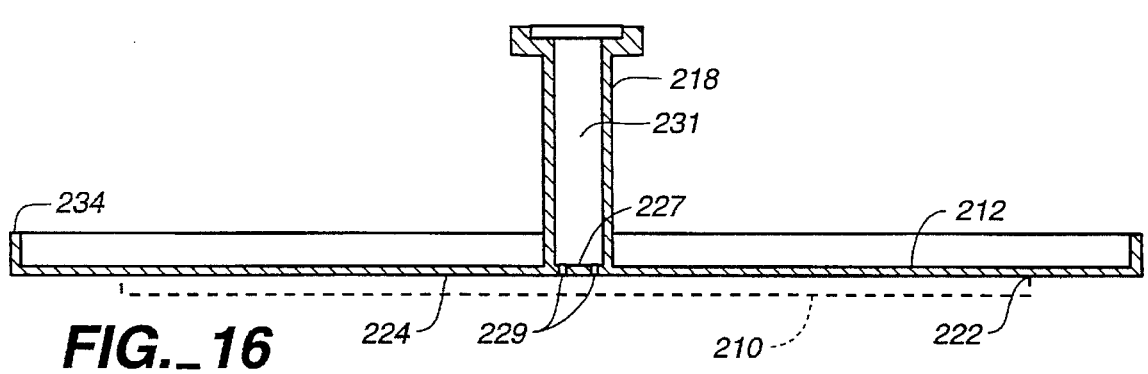
FIG._16

WAFER HANDLING WITHIN A VACUUM CHAMBER USING VACUUM

FIELD OF THE INVENTION

This invention relates to the structures and methods associated with the transfer and holding of semiconductor substrates (wafers) for face down processing, for instance for chemical vapor deposition (CVD) and similar processes.

BACKGROUND OF THE INVENTION

When processing semiconductor wafers, particles sometimes contaminate the wafer surface. While every effort is made to clean and filter gases passing through the processing chamber, sometimes chemical byproducts (vapor deposits) of the process itself form particles which temporarily adhere to the chamber inside surfaces. When these particles release from the surface they can fall on the face up surface of a wafer being processed causing contamination, causing the wafer to be rejected. The phenomenon of particle contamination is well known and described in U.S. Pat. No. 4,842,680, issued to Davis, et al., which includes a discussion of the comparison of the particle size with the time to fall one meter in a vacuum environment. Processing wafers in a face down position has been proposed and demonstrated in an effort to avoid such particle contamination and to take advantage of the effects of gravity in eliminating particle and gas distribution contamination.

Texas Instruments, Inc., has at various times proposed face down wafer processing as an improvement in wafer processing technology. However, to avoid contaminating a face down wafer, it is necessary that there be no contact with the down-facing processing surface of the wafer. One technique which has been attempted, is to use pins on the face of or at the edge of the wafer to support the wafer during processing. The use of metal or ceramic pins to support the wafer during processing causes deposition anomalies with inadequate adherence which in turn sometimes leads to flaking of the newly deposited but inadequately bonded material of the coating.

Face down wafer processing techniques are perceived to be especially beneficial when blanket tungsten is being deposited. The face down technique is also perceived to provide greater uniformity in the coating thickness.

The above-mentioned attempts to introduce wafer face down processing techniques have been examined and tested, and ultimately rejected for lack of a reasonably automated way of handling the semiconductor wafer without contaminating the down-facing surface during storage, transfer, and processing. The need exists for a means for supporting a semiconductor wafer in a face down position in a processing chamber which does not mark the processing surface of the wafer and is reasonably suited to automation.

SUMMARY OF THE INVENTION

This invention provides structures and methods to transfer and hold a semiconductor wafer during transfer into and out of a CVD type processing chamber as well as during processing. A vacuum grip is used at the back of a face down wafer to hold the wafer during transfer and processing.

In its simplest configuration a face-up wafer processing chamber is inverted and reconfigured to support the structures needed to handle and hold the wafer during transfer and processing. A circular wafer is placed face down on a robot blade which introduces the wafer into the processing chamber. The blade includes a recessed wafer receiving portion having sloped (beveled) conical surfaces upon which the wafer is supported on its lower surface very close to its outer edge. The blade moves into the processing chamber and locates the wafer directly above its processing location (position).

A transfer finger support assembly lifts the wafer from the blade; this assembly includes three transfer fingers which extend towards the wafer. Each finger has a tapered or sloped end surface located under the edge of the wafer such that when the transfer fingers are lifted, they lift the wafer from the robot blade. When lifting, the contact between the transfer fingers and the wafer is generally only at one point or a line contact on each finger on the lower surface of the wafer near its extreme outside edge.

The wafer is lifted by the three fingers of the transfer finger support assembly until the wafer reaches a point closely adjacent to a down-facing susceptor supported by a susceptor support arm of the susceptor support assembly. The down-facing susceptor includes a recessed face. The recess includes a series of wafer support points protruding from the recess to support the wafer on a flat plane. A vacuum system connected to the recess of the susceptor is then activated and the pressure differential between the processing chamber and the susceptor vacuum system provides enough force on the wafer to hold it tightly against the bottom face of the susceptor.

The transfer finger support assembly is then lowered and the transfer fingers are moved out of the path of the susceptor and wafer assembly as it descends to locate the wafer at its processing position. In the processing position the wafer and susceptor rests on a shadow ring assembly opposite a chamber gas distribution plate. The shadow ring assembly is also supported from the transfer finger support assembly.

A susceptor support arm supporting the susceptor is hollow and contains a metallic tube vacuum passage connecting recess on the susceptor face with a vacuum connection to a vacuum source. A thermocouple wire to the center of the back of the susceptor is run inside of this tube and connects to a thermocouple located at the center of back of the susceptor.

The design of the susceptor face and recess provides improved temperature uniformity across the face of the wafer being heated. Increasing the depth of the recess in the face of the susceptor behind the wafer reduces the heat transfer to the wafer at a location corresponding to the same location on the face of the susceptor. Since the heat loss at the periphery of the wafer susceptor assembly is high compared to the heat loss at the center of the susceptor, a predetermined configuration provides less heating or greater heat loss near the center of the susceptor compensates for the heat loss at the periphery of the susceptor and improved temperature uniformity across the wafer, resulting in a more uniform deposition coating on the surface of the wafer.

A transfer wafer support assembly is a "C" (or sickle) shaped partial hoop configured as a channel constructed of a ceramic material to resist damage due to the high temperatures of the processing chamber. The "C" shaped channel encloses a transfer finger rotation mechanism including links connecting the transfer fingers to move them simultaneously. Each finger shaft has an offset pin known as a crankarm of the finger shaft. The crankarms of adjacent finger shafts are connected by crankarm connecting members (links) so that movement of one connecting member moves both the crankarms and finger shafts simultaneously.

When the transfer fingers are rotated from their extended position to their retracted (stowed) position, the fingers are outside the path of the wafer and susceptor assembly as it descends to a position below the transfer fingers and into the shadow ring assembly at the wafer processing location.

The opening in the hoop of the "C" shaped transfer finger support assembly allows a susceptor support arm and susceptor support assembly to freely move up and down within the processing chamber independently of the transfer finger support assembly and avoids interference between the two.

The transfer lift fingers are retained on their finger shafts supported from the transfer finger support assembly by corresponding indentations in the finger shaft and the horizontal portion of the transfer finger. A ceramic ball is placed in the finger shaft indentation and is caught there by the corresponding indentation (close fitting half round keyway) in the horizontal portion of the transfer finger shaft connection hole.

Movement of the transfer fingers is provided by a transfer finger rotation mechanism. This rotation mechanism consists of the transfer fingers each being supported by a finger shaft. The finger shafts include two flanges at their top ends. A hole through the edge of these flanges, parallel to the longitudinal axes of the finger shafts receive pivot pins which act as crankarms for the finger shafts.

A set of crankarm connection members connect crankarms of adjacent finger shafts. Crankarm connection members have a hole at their extreme ends which match the pin hole on the finger shaft flanges such that when the connection member is placed between the flanges and the pin is placed in position, movement of the crankarm connecting member will cause the shaft to rotate on its bearings.

Three transfer finger configurations are provide around the "C" shaped transfer arm support member. Each of the transfer finger assemblies closest to the ends of the "C" shape have only one crankarm pin. The transfer finger assembly between the two end assemblies has two crankarm pins located adjacent to one another such that when one connecting member is moved in one direction the other connecting member moves in the same direction. However, an intermediate transfer finger assembly might have just one crankarm to which both crankarm connecting members could be connected or two crankarms on opposite sides of the rotational axis of the intermediate crankarm and then they would move in the opposite directions rather than in the same direction.

A drive member disposed at the "handle of the sickle" (the protrusion from the "C" shaped piece) is fixed to one of the crankarm connecting members such that moving this rigid piece will simultaneously move all of the transfer fingers between their respective transfer and stowed locations.

To prevent the crankarm connecting members from binding, a ball bearing contained in a circular counter-bore is placed under each crankarm connection member generally centered between the transfer finger assemblies. The connection member rides on the ball as the member moves.

The structure of the various assemblies also defines a method for handling a substrate within a substrate processing chamber. The method tracks the movement of the substrate by locating the substrate within a processing chamber above a substrate processing position; lifting the substrate to a susceptor assembly; applying a vacuum to the susceptor assembly to assure adherence of the substrate to the susceptor, disengaging the wafer lift mechanism from the wafer attached to the susceptor assembly and manipulating the wafer lifting mechanism to move out of the path of the wafer susceptor assembly in its path towards its processing location; and lowering the wafer and susceptor assembly to a processing location for processing.

The structure and method of the invention provides an improvement over the prior art in that automated transfer and processing of a semiconductor wafer in a face down condition can be performed with a high level of confidence and more easily than the prior art.

BRIEF DESCRIPTION OF THE DRAWINGS

FIG. 1, shows a perspective view of a wafer processing chamber with related external features, according to the invention;

FIG. 2, shows a top cross sectional view of the processing chamber of FIG. 1;

FIGS. 3A, 3B, 3C, 3D, 3E, and 3F show schematically based side cross sectional views of the processing chamber of FIG. 1, which depict the handing of a wafer as it is inserted into the processing chamber and is moved into a face down processing position, according to the invention;

FIG. 4, shows a partial side cross sectional view of a robot blade of FIG. 5;

FIG. 5, shows a top view of a robot blade, according to the invention;

FIG. 6, shows an exploded view of a susceptor lift assembly, according to the invention;

FIG. 7, shows a partial cross sectional view of the processing chamber of FIG. 1 including a cross sectional view of the susceptor lift assembly of FIG. 6;

FIG. 7A, shows a close-up view of the sealing arrangement of the susceptor lift assembly of FIG. 7;

FIG. 8, shows a side cross sectional view of a susceptor of FIG. 9;

FIG. 9, shows a view of a susceptor bottom face, according to the invention;

FIG. 10, shows an exploded view of a transfer finger support assembly, according to the invention;

FIG. 11, shows a partial cross sectional view of the transfer finger support assembly mechanism of FIG. 10;

FIG. 12, shows a top view of a "C" shaped channel of the transfer finger support assembly, according to the invention, with the "C" shaped channel cover removed;

FIG. 13, shows a typical cross sectional view of the "C" shaped channel, cut at 13—13;

FIG. 14 is a partial cut-away cross-sectional view through a wafer processing chamber illustrating another embodiment of the invention;

FIG. 15, is a plan view of the wafer support chuck shown in FIG. 14; and

FIG. 16 is a cross section along line 16—16 in FIG. 15.

DETAILED DESCRIPTION

To take advantage of the benefits of processing semiconductor substrates (wafers) in a face down position, the transfer and handling of those substrates must avoid contaminating the process wafer face. Contamination can result from floating particles that adhere to the substrate face during transfer and processing or from contact with any foreign object (metal, ceramic, or other) that might leave a few atoms or particles on the wafer face as a result of the contact (even the most gentle contact can leave a trace). Foreign particles of any kind, and especially particles having atomic structures that might affect the semiconductor performance must be avoided. Normal practice in the semiconductor processing industry is to support a wafer to be processed on or by its back face. When the front face (side of wafer to be processed) is facing up then the weight of the wafer and gravity are sufficient to keep the wafer properly positioned during transfer to and from, and while processing the wafer at, a processing location.

To process a wafer in a face down position, the wafer must be handled inverted (processing face down) or the wafer must be turned from the normal face up transfer orientation to the desired face down processing location. Contacting the wafers during handling is known to create a high probability of introducing defects at or near the edge of the wafer. Also, during normal processing a shadow (barrier) ring is provided to cover the edge of the wafer to seal around the wafer's edge to prevent process gases from migrating around the edge to deposit chemical vapor deposition (CVD) process products on the back surface of the wafer. Vapor deposition on the back side of the wafer is considered to be contamination and may be unacceptable, causing rejection of the wafer, for many semiconductor uses. To minimize rates of rejection and to discount any slight imperfections and contamination introduced at the edge of the wafers, the outside 3 millimeters of the wafer is considered to be an exclusion area. Therefore touching this circumferential band called the exclusion area can take place without causing contaminants to be introduced and the wafer to be rejected.

A robot blade 46 (FIG. 1) configured for handling a wafer to be processed in a face up position has a stair stepped (prior art) recess to receive a wafer being handled as shown by the dashed line 65 (FIG. 4). As can be seen in FIG. 4. a wafer which is supported on such a stair stepped series of lands is quite adequate when the processing face is the one facing up. The rear (back) side of the wafer in contact with the land can overlap the edge of the land without regard to contamination of the rear surface, as the rear surface is not to be processed.

However, when the wafer face to be processed is facing down, the width of the flat step or land must be minimized to prevent contacting the wafer outside the wafer's exclusion area and contaminating it. The overall width of the land to receive the wafer must be such that slight errors in placing the wafer on the land will be acceptable. This set of constraints requires that a flat land, to carry wafers to be processed in a face down position be very narrow and that the mechanism to place the wafer on the blade must locate the wafer very precisely. This prevents the wafer from hanging up on the land wall and/or becoming contaminated by having the face of the wafer touch the edge of the land.

To avoid touching the bottom center portion within the exclusion area of the wafer face 43 (FIG. 4) to be exposed to process gasses, an insertion means (robot blade) 46 having a recess 53 formed in a top surface thereof supports the wafer 40 while carrying it into and out of the chamber. The recess has a slope 60 at the edge of its bottom surface. The bottom edge 59 of the slope 60 is defined by an imaginary circle centered centerline 48 shown on the recess and having an diameter less than the diameter of the wafer 40. The top edge 58 of the slope 60 is defined by an imaginary circle centered on the recess an slightly above the bottom edge of the slope 59. The slope 60 (also referred to alternately as sloped surface, wafer edge support transition, at least one retainer, substrate supporting face, profile which slopes downwardly and inwardly toward the middle portion of the member, set of at least two smooth sloped annular band portions) is defined by its edges 58,59 with its surface sloping at a slight angle (preferably 1 to 3 degrees) along a line towards a point on a central axis of the blade recess 53 (matching the surface of a cone whose tip is at the converging point on the central axis, radiating at a constant angle as chosen—in this case between 1 and 3 degrees).

A robot blade 46, configured as above described, supports a wafer 40 without touching or damaging the bottom side or face 43 to be processed of the wafer. There is only a line contact at the wafer's edge 41. The wafer 40 can then be stored and transferred with its face 43 to be processed facing down with a high probability that there will be no contact with that face to be processed 43.

A wafer 40 with its face 43 to be processed in a face down position is supported as shown in FIG. 1 for transfer into a wafer processing chamber assembly 20. The processing chamber assembly 20 includes a processing chamber 21, a heater means (usually a set of heater lamps or bank) 24, a transfer finger control mechanism 130, and a susceptor position control mechanism 182 connected to a vacuum source or means for applying a vacuum is typically a separate vacuum pump or piping to the existing vacuum system(s) 184.

The processing chamber 21 is enclosed by several walls 25. The top surface or wall of the processing chamber includes a transparent window 23 (preferably of fused quartz construction) to allow the heater lamps 24 to shine through it to heat the process. The process chamber walls 25 also include a valved aperture or access port 22 communicating with the interior portion of the chamber 21 as shown in plan view (FIG. 2). When the access port 22 is open, the robot blade 46 supporting the wafer can carry the wafer to a wafer transfer position 30 (FIG. 3B) for handling within the chamber 21. FIG. 2 shows additional elements of the susceptor 138 and its mounting elements, and wafer transfer fingers 76a–c, and their mounting means.

The configuration of the susceptor is shown in more detail in FIGS. 6 and 7. The configuration of the "C" shaped finger support channel member is shown in FIGS. 10 and 11.

The wafer itself is not seen in the top view of FIG. 2 as it is located below the susceptor 138 and generally has an outline very close to the outline of the susceptor 138 (not shown) in the wafer transfer position (second position) 30 directly below the susceptor 138 and centered among a set of transfer fingers 76 (76a, 76b, 76c) as best seen in FIG. 3B and 2.

Once in the chamber 21 (FIG. 2) the robot blade is configured to locate the wafer 40.

Transfer fingers 76 when they are in their lifting position/ configuration 77 (FIG. 2) extend to the edge 41 of the wafer 40. The protruding (medial) ends of the transfer fingers 76 have a sloped (beveled) end portion 81 (FIG. 11) not unlike the sloped band 60 of the robot blade 46 (FIG. 4). The robot blade sloped retaining surface 60 works best when the lifting surface is a conically shaped surface, because a conically shaped surface provides a continuous uniform support of the wafer's bottom near the wafer's edge. When three transfer fingers 76 are used to lift the wafer from the robot blade 46, their three contact points with the wafer define a plane, and the wafer when supported on the three fingers coincides with this plane. Therefore, conically shaped surfaces on the sloped end portions 81 of the fingers 76 are not required; sloped surfaces that are flat, convex, or other shapes will work as long as a nominal beveled angle of approximately one degree or more is provided.

The robot blade 46 is configured to have a width 47 (FIG. 5) in the area of the wafer support recess 53, smaller than the diameter 42 of the wafer to be processed 40 (shown in phantom in FIG. 5). The robot blade leading end 50 which extends beyond the diameter of a wafer carried by the blade, includes a notch 51 in the end of the blade 46. The notch 51 separates the imaginary smooth continuous annular band defined by the slope 60 into two portions, a first sloped portion 61 and a second sloped portion 62. These first and second portions 61, 62 have walls at their outside edges 55, 56 defining the edge of the slope at the leading edge 50 of the blade 46. The blade has a following end 49 in contrast to the leading edge 50. This blade configuration makes access to the wafer perimeter available to the three transfer fingers 76a, 76b, 76c shown in FIG. 2.

The fingers 76 are supported by a "C" (sickle) shaped channel member 106 (FIG. 2) which supports all three transfer fingers and moves them up and down in accordance with the wafer transfer finger assembly 130. The open hoop ("C" shape) is needed to avoid interference with the susceptor support arm 165 supporting susceptor 138. The arm 165 is in turn supported by and is moved in accordance with the susceptor position control mechanism 182. The susceptor 138 and the "C" shaped channel member 106 can then move up and down independently and without regard to one another. FIGS. 3A through 3F show step by step the movement of the wafer 40 and the various wafer manipulating pieces as the wafer 40 is brought into the processing chamber 21 and to the location at which wafer processing (CVD or other processes are performed). FIGS. 3A through 3F are schematic side views of the processing chamber 21 a generally depicted in FIG. 2 at various stages of wafer movement. In this view the susceptor position control mechanism 182 is shown, but the transfer finger control mechanism 130 is not. Although the transfer fingers 76 to lift the wafer are actually oriented at 120 degree increments, in these drawings two fingers 76 are shown directly across from one another to increase clarity. A shadow ring assembly 125, not shown in FIG. 2, hangs from and is supported by the "C" shaped channel 106 and moves in unison with it. When the actual processing of the wafer within the chamber is started, the "C" shaped channel 106 is moved to its lowest position 31 opposite a gas distribution plate at the bottom of the processing chamber.

FIG. 3A shows the processing chamber 21 with an open aperture 22. The robot blade 46 supporting the wafer 40 in a face down position in its recess 53 is being moved through the access port 22 into position opposite the susceptor front face (substrate support having an engaging surface, bottom face of susceptor) 139. The susceptor 138 has a back 155 which is exposed through window 23 to heater lamps 24 which shine through the window onto and thereby heat the susceptor 138. The susceptor 138 is positioned at a first upper position by the susceptor position control mechanism 182 through arm 165. The "C" shaped channel 106 is positioned at its low position. The robot blade 46 inserts the wafer 40 into the chamber at a location opposite the access port 22 and above the location of the transfer fingers 76 and below the face 139 of the susceptor 138. None of these elements come in contact with one another during the blade movement. At this time the pressure between the inside of the chamber and the outside of the chamber (often a load lock chamber also at vacuum pressure—not shown) is equalized through the access port 22.

FIG. 3B shows the robot blade 46 at a wafer transfer position 30, with the wafer at a central position in registration with the susceptor and ready to be lifted off the blade by fingers 76. The dashed lines 32 designate the side limits of the path of the susceptor and wafer combination (once they are joined) from the susceptor location above the wafer transfer position 29 (FIG. 3C) to a subsequent and lower wafer processing location 31 (FIG. 3F). At the wafer processing location the wafer will be in contact with the shadow ring assembly's 125 complementary wafer susceptor assembly receiving flanged central opening.

FIG. 3C shows the transfer fingers 76 positioned in their fully extended wafer lift position 77 and having lifted the wafer 40 off from the robot blade 46 up to a position adjacent to the susceptor face 139, corresponding with the wafer raised position (wafer receiving/releasing position or first position) 29.

It would be difficult for the susceptor itself to reliably lift the wafer 40 directly from the robot blade 46, as a tight clearance is required between the wafer and susceptor face for vacuum sealing to occur. The thin cross section blade could droop unacceptably at its distal end thus interfering with the capability of the susceptor to repeat a clean pickup time after time. Additionally, to aid the susceptor if it were to be used directly in picking up the wafer it would be well to have a large initial differential pressure across the wafer. When the robot blade 46 is cantilevered through the process chamber aperture opening, the pressure in the process chamber 21 cannot change much from the pressure outside the chamber in the load lock chamber. Thus, lift fingers 76 or other similar apparatus preferably are used for reliably moving the wafer adjacent the susceptor face to the position shown in FIG. 3C.

FIG. 3D shows the robot blade 46 having been removed and the access port 22 closed to isolate the processing chamber 21 from its surroundings. The gas pressure inside the processing chamber can then be adjusted as desired. A single low pressure vacuum system can be used to operate the system. Excess gas can be introduced into the processing chamber to raise its pressure while maintaining the higher pressure by using a processing chamber throttle valve between the processing chamber and the vacuum system. The susceptor face 139 includes a recess to manifold vacuum pressure directly from an external vacuum piping system across a large portion of the face of the susceptor. The wafer 40 placed adjacent to the susceptor face 139 experiences a differential pressure across it as a vacuum is drawn through the susceptor 138, through the susceptor support arm 165, through the vertical position adjustment bellows, and through a connection to the vacuum system outside of the processing chamber. In this configuration according to the invention, once the differential gas pressure across the wafer increases to a predetermined value such that the resulting differential force equals and exceeds the weight of the wafer (approximately 8 torr. for a 150 mm wafer as there is some leakage of gas behind the wafer as a perfect seal is not provided, accounting for the increase in pressure over the theoretical value needed to overcome the weight of the wafer) then the wafer 40 will remain in tight contact with the face 139 the susceptor without other support.

FIG. 3E shows the transfer fingers 76 (along with the "C" shaped channel) having been dropped down away from the susceptor face 139. The transfer fingers 76 are also shown as having been rotated out of the susceptor travel path 32. The "C" shaped channel is dropped to its lowest location to position the shadow ring assembly 125 in position to process the wafer 40.

FIG. 3F shows the susceptor and wafer assembly having descended to the wafer processing position (third position) 31 opposite the gas distribution plate and manifold 26 in position for processing.

FIG. 6 shows an exploded view of the susceptor lift assembly 177 and susceptor 138. The latter includes a the susceptor disk 138a which is a generally flat plate with a back surface 155 facing a ceramic heat regulation disk 160 defining a series of Swiss cheese like configuration holes therethrough. The holes in the ceramic disk allow light from the heating lamps to selectively pass through the disk 160 to heat the back 155 of the susceptor 138. A particular hole pattern in the disk 160 provides a particular temperature distribution across the diameter of the susceptor. Thus the hole pattern shown is representative, but not necessarily identical, to the hole pattern which is used in a given situation. Changes in the hole pattern will change the temperature distribution observed across the susceptor. It is desirable to have a uniform susceptor temperature distribution, as this generally correlates directly with the temperature distribution of the wafer resting against the susceptor face. The CVD processes being performed in this processing equipment are generally temperature sensitive, such that temperature differences across the wafer surface at different wafer surface locations result in different vapor deposition rates at locations where the temperatures are different. To maintain temperature stability of the wafer during process conditions it is important that the wafer remain in close intimate contact with the susceptor. The susceptor 138, being a hard anodized aluminum and having a high thermal conductivity, acts as a heat buffer to equalize changes in temperature.

In this configuration, according to the invention, the wafer is held intimately against the susceptor face by a differential pressure. As thus appreciated from FIG. 8, a recess 143 generally centered in the face 139 of the susceptor acts as a manifold to assure that such a differential pressure will be applied uniformly on the wafer opposite the recess 143. A susceptor face 139 has a cross sectional profile as shown in FIG. 8. The susceptor face is covered by a wafer 40 shown with dashed lines. An imaginary plane surface 152 generally corresponds to the back face of a flat wafer 40. A flat wafer perimeter face portion (substrate supporting surface, circumferential edge of the wafer) 150 acts as a boundary and a seal between the wafer 40 and the susceptor face 139. The space inside the perimeter face portion 150 includes more annular bands which are recessed back from the theoretical planar face of the susceptor surface 152. A series of wafer support points 144 rise from the bottom of the recess to give support to the wafer 40 spanning the recess 143. The wafer support points rise like small mountains from the base of the recess. Each support point 144 has a peak that is flat and coincident with the imaginary plane 152 correlating with the face of the wafer. The plateau at the peak of each support point has an area of approximately 0.5 square millimeters (0.06 in. by 0.015 in.). This contact surface area when in contact with the wafer 40 produces a negligible heat transfer rate that increases the uniformity in temperature distribution across the surface of the wafer.

When a differential pressure exists across the wafer (even when the wafer appears to be tightly held to the susceptor) a slight gas leak or migration exists across the sealing area between the perimeter face portion 150 of the susceptor and the correlating surface of the wafer. This gas leakage provide the beneficial effect of producing a heat transfer due to the heating and/or cooling of the gas as it passes manifolded through the recess to the central vacuum passages 141. The heat lamps are a source of heat for the process.

The temperature distribution across the face of the susceptor affects the temperature distribution across the wafer. The geometry of a disk such as the susceptor and the wafer, provides that it loses temperature more rapidly at its perimeter. To increase the temperature uniformity across the surface of the wafer, it must be heated more at its periphery than at its center. The susceptor configuration as shown in FIGS. 8 and 9 provides a greatly improved temperature distribution over a flat faced susceptor or even a susceptor having a recess with a uniform depth throughout. Realizing that the depth dimensions as shown in FIG. 8 are greatly exaggerated, a series of annular bands 145 are provided from the center of the susceptor to the diameter at the inside of the perimeter face portion 150. In this configuration the depth of the center recess/band is approximately 0.010 in.; the depth 146 of the next annular band is approximately 0.020 in.; the depth 147 of the uniform depth annular band adjacent to the 0.020 depth band is 0.010 in.; and a prescribed transition configuration band 148 provides a sloping transition from a first predetermined depth annular band edge of approximately 0.010 in. to an outer predetermined depth configuration (which in this instance merges with the perimeter face portion 150) has a depth of zero. The temperature distribution on the face of the wafer can be adjusted by increasing the depth of the annular band in the area where a temperature reduction is desired and decreasing the depth of the annular band in areas where an increase in temperature is required. Changes in the Swiss cheese like hole pattern on the back of the ceramic plate can provide added flexibility if larger adjustments need to be attempted. In this configuration, the wafer support points are laid out at a 45 degree angle to each other and the central recess has a diameter of 1.25 in., the first band has a diameter of 2.48 in.; the third band has a diameter of 4.3 in. (but this band has an intermediate wafer support point at a diameter of 3.51 in.; and the transition band ends and the perimeter face portion begins at a diameter of 4.85 in. (for a 150 mm diameter wafer).

The susceptor (as shown in FIG. 6) has a hub 156 by which it is supported from four screw holes. A thermocouple well is centered in the hub 156 to receive a thermocouple 158 (FIG. 7).

The susceptor is supported by a hollow ceramic (alumina) susceptor support arm 165. The arm 165 contains a vacuum tube (susceptor vacuum suction line, vacuum passage) 170, preferably aluminum. The vacuum tube 170 is a slip fit into a hole connecting the aluminum vacuum tube to the back of the susceptor 138. A grounding strap/wire (ground cable— aluminum) 174 is also connected to the susceptor end of the vacuum tube. Four assembly screws 172 connect and clamp the end of the vacuum tube 170 and the ground cable 174 to the end of the hollow susceptor support arm 165 and the susceptor hub 156. The other end of the vacuum tube in connected to an aluminum hollow cup with a flange 171. The hollow cup with a flange fits inside a circular opening at the drive end of the arm 165. The bottom of this cup 171 is covered by a circular flat plate, made of Haynes 242. As the temperature of the assembly approaches the processing temperature of approximately 485 degrees Celsius the aluminum items contained in the ceramic housing attempt to expand, but are restrained by the ceramic housing. The differential expansion causes the aluminum tube to slide against its adjoining parts and maintain the pressure differential between process chamber pressure and the vacuum system pressure. The close fit also makes an electrical connection between parts that are pressed together in this process. Use of the grounding strap 174 assures a continuous electrical ground connection (grounding) for the susceptor.

The thermocouple 158 and thermocouple wiring is routed through the vacuum tube 170 and inserted in the thermocouple well in the middle of the susceptor 138. The thermocouple well is located in the vacuum passage of the susceptor (FIG. 7). The thermocouple wiring passes back through the vacuum passage and exits the vacuum passage at a thermocouple wiring seal to provide thermocouple wiring ends 159 to be connected to thermocouple readout instrumentation.

The susceptor support arm 165 has a cover 166 to protect the contents from excessive temperatures (exposure to the process heat lamps shining directly on the back of the susceptor and susceptor arm) as well as isolate the contents from the potentially harsh chemical environment present at various stages of processing within the processing chamber. The grounding cable 174 passes out from the hollow arm and is grounded on the wall of the processing chamber which is normally constructed of a conducting material such as aluminum. When Plasma Enhanced CVD (PECVD) is being used the ground cable is required to positively ground the susceptor 138 The grounding wire 174 end must be loosely routed as the susceptor must be free to move up and down as required to transfer and hold the wafer during processing.

The vacuum tube end cup 171 is connected to a bottom flange 178a (FIG. 7A) of a lifting shaft 178, which are both attached to the bottom flange of a susceptor vertical adjustment bellows 179. The bellows 179 interior is maintained at ambient pressure. The bellows separates chamber vacuum from ambient pressure. The lift shaft 178 (FIG. 7A) is guided by a lift and guiding mechanism (not shown), which holds and moves the susceptor arm consistently and without vibration.

The vacuum seal to the lifting shaft is made by using an O-ring 178g compressed by a thermocouple wire potted sealing sleeve 178b which forces the O-ring 178g towards a reduction in the inner diameter of the upper portion 178d of the lift shaft 178 (FIG. 7A). When the O-ring 178g is forced against the narrowing shape of the upper portion 178d, the seal sleeve 178b resting on the flange surface outside the offset hole 178e presses the O-ring into sealing contact with both a potted sleeve 178c (an epoxy filled tube through which the thermocouple wire 168 passes and is fixed) and the inner surface of the top portion 178d of the lift shaft 178. Careful review of FIG. 6, reveals the hole 178e being offset from the center of the lift shaft bottom flange. The thermocouple wire 168 passes along the centerline of the bottom flange and is centered on the seal sleeve 178b. The offset hole 178e allows a threaded thermocouple tip and the potted sleeve 178c to pass (especially for assembly and disassembly) while providing a support surface on which the sealing sleeve 178b can rest to compress the O-ring 178g for sealing. The O-rings 178g are compressed when the lift shaft flange 178f is assembled (flat and/or spring washers, as shown in FIG. 6, may adjust the clearance and compression of the O-rings 178g). The two flange surfaces are also sealed by an O-ring or other similar sealing means. Flexible vacuum tubing is connected to vacuum tube connection 175.

The susceptor assembly 177 generally as described and the vacuum source providing a vacuum to the vacuum connection 175 constitute a handling means.

FIG. 10 shows an exploded view of the transfer finger support assembly 112 which supports the shadow rings 126,127,128 and supports and manipulates the transfer fingers 76a, 76b, 76c according to rotation assembly 111 of a transfer finger control mechanism 130. The movement of the transfer fingers 76a, 76b, 76c as described above is manipulated by turning the finger shafts 86,87,88 (FIGS. 10 and 11). The finger shaft 87 (preferably made of Haynes 242® has a central rotational axis 79. The finger shaft also has an end flange 84 and a mid flange 85 at its top end.

The lower end of the finger shaft passes through a hole in the bottom of the "C" shaped channel. The bottom of the "C" shaped channel 106 has a thick cross section 117 (FIGS. 10,11,13). However, at the finger shaft locations in the "C" shaped channel, the channel has finger shaft bearing cavities 113, to receive and locate a set of finger shaft bearing housings 89. A cross section of the bearing housing 89 is shown in FIG. 11. The finger shaft 87 includes bearing grooves in which bearing balls (preferably ceramic) are placed. The bearing balls are captured by the smooth inside walls of the inside of the bearing housing. A bushing 89a encircles the finger shaft under the bearing balls, which supported on a set of flat washers 89b acts as a thrust bearing and vertical stop for the finger shaft 87, Haynes 242. A lock wire 89c, to prevent the bearing balls from spilling when turned over, passes through the bearing housing 89, only being touched when the finger shaft tries to move out of the bearing housing 89.

The end flange 84 and the mid flange 85 of the finger shaft 87 act as part of a crankarm (lever arm) to crank (rotate) the finger shaft when one or more pins 93 passing through aligned holes in both the end flange 84 and the mid flange 85 are moved. The crankarm holes are generally parallel to and displaced from the central rotational axis 79 of the finger shaft 87 by a lever arm distance 91. When crescent shaped crankarm connecting members 108, 109 are connected to the crankarm pins by passing the pins through the holes at the end of the members 108, 109, the crankarm 87 rotates as the connecting members 108, 109 move. When the crankarms 93 are disposed as shown in FIG. 12, both crankarms located outside an axis between adjacent finger shafts, movement of the connecting member 108 in a first direction 118 along the curved axis of the "C" shaped channel causes a similar motion in a second connecting member 109. This motion in the first direction 118 causes the finger shafts 86, 87, 88 to be rotated with their transfer fingers 76a, 76b, and 76c to the wafer lifting position/configuration 77. When crankarm connecting members are moved in the second direction 119 the finger shafts and the transfer fingers rotate to their retracted/ stowed position/configuration 78.

In this configuration described the small clearances between the pieces limited the options available to locate the crankarm locations. The space available between the end and mid flanges 84, 85 of the finger shaft as presently configured, limits the number of crankarm connection members that can be connected to one crankarm pin. In the configuration as shown in FIG. 12 two crankarm pins are used at the intermediate finger shaft 87. All finger shafts rotate in the same direction. In another configuration with more space and clearance the alternate finger shafts could be oriented to rotate in opposite directions. The present configuration shows finger shafts rotating in the same direction, but connected to two separate crankarms 93.

The crankarm connection members 108, 109 are crescent shaped (narrow at the ends and wide in the middle) to provide acceptable structural stability and prevent buckling during the application of a translational force. If a crankarm connection member were supported only at its end pinned ends, its middle section would sag and rub on the inside of the "C" shaped channel and cause the connection member to crankarm pin connection to bind, making transfer finger adjustment (movement) difficult. To maintain the vertical alignment of the crankarm connecting members 108, 109 (FIG. 13), a generally flat bottomed circular indention 115 in the thick cross section 117 of the "C" shaped channel 106 provides a restricted (walled) cavity in which a bearing ball 114 (preferably made of a ceramic material such as alumina for temperature resistance/durability) can roll. The bottom surface of the crankarm connection member (108, 109) rests on the top surface of the ball 114 and the ball rolls in the indentation 115 as the connection member is manipulated to rotate the finger shafts and transfer fingers. A top cover 107a, covers the top of the "C" shaped channel and reduces the severity of the internal component exposure to the extremes of temperature and chemical exposure during process cycles.

The crankarm connection member 108 is manipulated by being attached to a rigid connecting (triangular) piece 110. This piece 110 includes an end hole 110a that engages an offset pin 75 in the end of a rotation control shaft 72 of the transfer finger control mechanism 130. When the control shaft 72 rotates the offset pin 75, engaged in the end hole 110a of the fixed drive link 110, translates (moves the end of the fixed drive the fixed drive link 110). Since the fixed drive link 110 is constrained by being connected to the first crankarm connection member 108 and the first crankarm connection member is fixed between crankarms (pins) of adjacent finger shafts 86, 87, the translation of the fixed drive link 110 causes crankarm connection members to move in a direction (118 or 119) along the axis of the "C" and the finger shafts and transfer fingers to rotate. A reverse rotation of the control shaft 72 will cause a reverse rotation of the transfer fingers.

The bottom of the drive protrusion from the "C" shaped channel 106 is covered by a cover 107b (preferably Haynes 242).

The transfer finger control mechanism 130 includes a lift shaft 74, vertical movement seal bellows 71, and a transfer finger rotation mechanism 111. The transfer finger rotation mechanism 111 is pinned to a crankarm 72a which is rigidly bolted to the control shaft 72. The rotation mechanism moves up and down with the support mechanism 106 and controls the rotation of the transfer fingers as described above. The transfer finger support assembly 112 moves up and down according to process requirements. A support assembly lift mechanism (not shown) attaches to the lift shaft 74 to precisely control the raising and lowering of the assembly 112. Seals to prevent vacuum leakage in addition to the bellows seal 71 are provided, but not shown.

The transfer fingers 76 are connected to the fingers shafts 86, 87, 88 by use of snug fitting interfering balls 95 (FIG. 11). The bottom of the finger shafts include a hemispherical indentation 90. A tight (0.001–0.002") (slip fit) fitting hole 82 near the end of the horizontal section of the transfer fingers slips over the end of the finger shaft (87) and is placed above the hemispherical indentation 90. This transfer finger hole 82 includes an offset half-round keyway (half cylindrical) 83 on one bottom side of the horizontal transfer finger section 80, such that when the offset half-round keyway 83 is aligned with the hemispheric indentation 90 in the finger shaft 87 and the snug fit ball 95 is positioned in and protruding from the slight indentation 90 of the finger shaft 87, lowering of the horizontal section 80 of the transfer finger to the ball 95 will cause the ball 95 to be caught in the offset half round keyway 83 of the hole 82 and support the horizontal member 80 of the transfer finger until the horizontal member 80 is raised and the ball 95 is released.

The shadow ring assembly 125 includes an inner shadow ring 126, an intermediate shadow ring 127, and an outer shadow ring 128. The three rings are nested, by overlapping flanges as can be seen in FIG. 11. Several (in this case three) ring are used to reduce the effect of differential thermal expansion between the hotly heated central ring and the relatively cool perimeter ring. A single ring spanning the distance could experience temperature differences in excess of 200 degrees Celsius which would create thermal stresses that would fracture such a single ring. By using several rings to span the distance, the temperature gradient across each ring is greatly reduced and the movement between rings avoids excessive thermally induced stresses which could cause the rings to fracture. In this configuration the inner two rings 126, 127 are made of a ceramic material such as alumina and the outer ring 128 is aluminum.

The outer shadow ring 128 is supported from the "C" shaped channel 106 by adjustable hanger screws 129. These screws 129 (preferably made of Haynes 242) are threaded into holes in the outer ring 128 and are provided with a lock nut—preferably Haynes 242 to maintain any adjustment performed for the ring support. It is important that the wafer to be processed be maintained parallel to the adjoining gas distribution plate 26 so that uniform deposition occurs. These adjustment screws allow for such an adjustment even when the ends of the "C" shaped channel 106 sag.

The upper end of the hanger adjustment screws 129 are captured by a spacer plate 100 and a hanger adjustment screw head retaining plate 101. A circular protrusion (flange, ball, etc.) at the top of the hanger screws 129 is captured by a slot in the screw head retaining plate 101. The head passes through the retaining plate and into a screw head cavity in the spacer plate 100. The hanger screw 129 can turn freely when its head is so supported while maintaining a constant vertical position.

The spacer 100 and the screw head retaining plate 101 are attached to the bottom of the "C" shaped channel opposite the location of the finger shaft bearing housings 89. Fasteners (bolts, screws) preferably made of Haynes 242 pass through the flanges of the bearing housing 89, pass through holes in the bottom of the "C" shaped channel 106, pass through holes in the spacer plate 100 and are secured in threaded holes in the screw head retaining plates 101. The screws, the bearing housing 89, the spacer plate 100, and the retaining plate 101 are all preferably made of Haynes 242.

Turning now to FIG. 14, a different form of the wafer handling apparatus is illustrated.

In this figure the wafer processing chamber 202 is shown to include upper and lower funnel shaped quartz windows 204, 205 and ports 206, 207 respectively for injecting and exhausting a processing gas into and from the chamber 202. Inside the chamber 202 a semiconductor wafer 210 is shown supported face down by a wafer support chuck 212 in a manner similar to that described with reference to the above described handling means (chuck). Both the wafer 210 and the environment within the chamber 202 can be heated by upper and lower banks of heater lamps 215, 216 respectively. If the process which the wafer is to undergo does not require heating then lamps can be omitted and a wafer support of a different design can be utilized. Also, the heating of the susceptor does not need to be accomplished by lamps, but can be accomplished by using a heating coil in a susceptor of a thicker design.

As with the embodiment illustrated in the previous figures, the chuck 212 is movable vertically between the wafer processing position shown and a wafer engagement position shown in broken lines 213. This is done under action of a lifting shaft 218 which connects the chuck 212 to lifting apparatus 220 mounted outside of the chamber 202. The robot arm for moving the wafer into and out of the chamber is not shown in this figure. As with the embodiment illustrated previously, the wafer is supported face down by suction which is applied at the interface between the chuck 212 and the back side 211 of the wafer 210. This suction is applied via a bore formed along the center of the shaft 218.

Details of the chuck 212 are shown in FIGS. 15 and 16. As can be seen from the figures the chuck 212 has a pocket 222, typically 0.02" deep, formed therein. This pocket includes a flat wafer supporting face 224 and a central zone 227 at which the suction force is applied to the back side 211 of the wafer 210. This figure the central zone 227 consists of six concentrically arranged holes 229 formed through the chuck 212. The holes are typically 0.05" in diameter and are arranged on a 0.2" diameter circle. It is through these holes 229 that the suction can be drawn at the interface between the wafer 210 and the surface 224. The suction drawn at this interface is communicated over most of the backside 211 of the wafer and so the wafer is held in position within the pocket 222.

This configuration is particularly suited to processing wafers at elevated temperatures, say above 750 degrees C., as the flat wafer supporting face 224 provides very good support for the wafer and prevents wafer slip. Tests have shown that at a processing temperature of 1100 degrees C., a pressure differential of 3 Torr across a 6" diameter wafer has resulted in a 100% slip free surface.

From FIG. 16 it is apparent that the lifting shaft 218 has a central bore 231 formed in it. This central bore 231 provides a passage between the apparatus (not shown) used for providing the suction and the central zone 227 on the face of the chuck 212. Although not essential to this invention, this figure also shows a circumscribing skirt 234 which serves to increase the rigidity of the chuck 212. This skirt 234 is important in cases where the chuck is subjected to high processing temperatures and would, as a result of this high heat, lose some of its rigidity. This is particularly so as the main body of the chuck 212 (in the illustrated embodiment) is relatively thin (typically 0.145" thick). In some applications it is necessary to keep the chuck 212 thin, as the chuck must have a relatively low thermal mass so as to allow a rapid heating and cooling of the environment within the processing chamber 202 in other applications the chuck 212 may have a thick cross sectional area with a large thermal mass and would therefore take longer to heat up and, once heated, longer to cool down. Accordingly, the structure as illustrated in this figure has been provided.

Even though a single and specific configuration of the chuck 212 is shown in the FIG. 16, it will be apparent to anyone skilled in the art that this is only one of many possible configurations and that many alternative configurations are possible.

Although the present invention has been described above in terms of specific embodiments, it is anticipated that alterations and modifications thereof will no doubt become apparent to those skilled in the art. For example, it is envisaged that the principles of vacuum holding of a wafer during processing in a processing chamber could be applied to supporting a wafer vertically or for supporting any other substrate during any substrate processing operations. It is therefore intended that the following claims be interpreted as covering all such alterations and modifications as fall within the true spirit and scope of the invention.

We claim:

1. A substrate processing apparatus for processing a downwardly facing substrate comprising:

a processing chamber;

a substrate mount within the chamber defining a downwardly facing substrate mounting surface adapted to engage a back face of a substrate, said mount providing a passageway between said mounting surface and a source of vacuum; and substrate transfer apparatus having at least one set of beveled surfaces for supporting a substrate, wherein each of said at least one set of beveled surfaces are configured to support at least three points defining a plane on an edge of a front face of said substrate, wherein at least a portion of said transfer apparatus includes one set of said at least one set of beveled surfaces, wherein said portion of said transfer apparatus is vertically movable to bring the substrate mounting surface into proximity with the back face of the substrate facing upwardly;

wherein when: said downwardly facing substrate mounting surface and back face of the substrate are adjacent, said passageway is in communication with said source of vacuum, and the pressure over the substrate backside is sufficiently below that of the processing chamber that the substrate is urged and held against the downwardly facing substrate mounting surface, the substrate transfer apparatus is configured to be removable from the substrate so that the downwardly facing surface of the substrate to be processed is fully exposed to the chamber.

2. A substrate processing apparatus as in claim 1, wherein said substrate mount comprises a face-down susceptor assembly defining a susceptor surface for engaging the back face of the substrate;

wherein said passageway comprises a conduit terminating at said surface and adapted for connection to said source of vacuum; and wherein said one set of said at least one set of beveled surfaces of said portion of said substrate transfer apparatus is configured to support a substrate to move a substrate supported on said at least one set of beveled surfaces vertically to and from a position in registration with said susceptor surface with a substrate face to be processed oriented in the downwardly facing position.

3. A substrate processing apparatus as in claim 2, wherein said substrate transfer apparatus includes an insertion member which moves said substrate in to and out of the chamber.

4. A substrate processing apparatus as in claim 3, wherein said insertion member includes another of said set of beveled surfaces which support the substrate at said edge of a front face of the substrate.

5. A substrate processing apparatus as in claim 3, wherein said one set of said at least one set of beveled surfaces comprises beveled surfaces of vertically movable fingers configured to lift the substrate from the insertion member and into contact with said downwardly facing substrate mounting surface.

6. A substrate processing apparatus as in claim 2, wherein said conduit includes a recess in said surface for engaging the back face of the substrate to manifold the vacuum from the vacuum source over the back face of said susceptor;

said recess including a generally uninterrupted cavity from it center to a circumferential planar sealing band, said cavity including a series of wafer support points to support the substrate and maintain its flatness as it spans the recess.

7. A substrate processing apparatus as in claim 2, wherein said substrate mount moves vertically to move said substrate opposite a gas distribution plate/manifold in the processing chamber which injects deposition process gasses upwardly towards the wafer.

8. A method for handling a substrate in a processing chamber, comprising the steps of:
   engaging a substrate to be processed edgewise with a substrate transfer apparatus;
   transferring the substrate to be processed to a position adjacent a downwardly facing mounting surface of a substrate mount with the substrate back face oriented upwardly; and
   applying a vacuum between the adjacent substrate back face and said mounting surface to create a differential pressure on opposite faces of the substrate so that the substrate is drawn against the substrate mount to retain the substrate via the back face only and to fully expose the front face to be processed while oriented downwardly to the internal chamber processing environment, while minimizing contact to the front face and the possibility of particles depositing on the front face, such that moving said substrate mount vertically positions the substrate in a location to be processed.

9. A wafer processing chamber assembly comprising:
   a wafer transfer blade for supporting only the edges of a wafer to move a wafer horizontally to a chamber wafer transfer position, said wafer transfer position being disposed directly above a wafer processing position;
   a transfer finger support assembly configured to move vertically between a transfer finger assembly highest position and a transfer finger assembly lowest position according to a transfer finger control mechanism, said transfer finger assembly having transfer fingers to lift said wafer from said wafer transfer position to a wafer raised position and to lower the wafer from said wafer raised position to said wafer transfer position while making contact only with the edges of the wafer,
   a face down susceptor assembly configured to manifold a vacuum (pressure) over the susceptor face as a wafer is brought closely adjacent to and is placed in intimate contact with the susceptor face, in said wafer raised position, wherein a portion of the wafer perimeter sealingly contacts a corresponding portion of said susceptor face, said susceptor assembly being configured to raise and lower said susceptor according to a susceptor position control mechanism;
   wherein when a wafer is positioned adjacent to said face of said susceptor and the pressure in a susceptor vacuum suction line is less than the pressure in said processing chamber a differential pressure is created across the wafer, when the force on the bottom of the wafer due to the differential pressure across the wafer is equal to or greater than the weight of the wafer, the wafer is held against the bottom face of the susceptor by the gas pressure in the chamber;
   wherein said face down susceptor assembly moves vertically to a processing position once said wafer is engaged with said face.

10. A wafer processing chamber assembly as in claim 9, further comprising:
    a shadow ring assembly supported from said transfer finger support assembly.

11. A wafer processing chamber assembly as in claim 10, wherein said transfer finger support assembly includes a transfer finger rotation mechanism, to swing said transfer fingers out of the path of said wafer and susceptor according to a transfer finger support control mechanism as the wafer laden susceptor moves from a wafer receiving/releasing position to said wafer processing position.

12. A wafer processing chamber assembly as in claim 9, wherein said transfer finger support assembly includes a transfer finger rotation mechanism, to swing said transfer fingers out of the path of said wafer and susceptor according to a transfer finger support control mechanism as the wafer laden susceptor moves from a wafer receiving/releasing position to said wafer processing position.

13. A wafer processing chamber assembly as in claim 9, wherein said wafer transfer blade includes:
    a bar having a width dimension less than a width dimension of a wafer to be supported, said bar having a recess formed therein in a top surface thereof at a location near the end of said bar, said recess includes a wafer edge support transition between an imaginary ring forming the bottom edge of said transition and an imaginary ring forming the top edge of said transition, wherein at least a portion of said transition is disposed at or above the bottom of said recess and said top edge of said transition is at or below the top of said bar;
    said bar includes a set of at least two smooth sloped annular band portions configured to match an imaginary continuous sloped annular band having an inner circular boundary at the bottom edge of said transition having a diameter less than the diameter of the wafer to be supported and having an outer circular boundary at the top edge of said transition having a diameter greater than the diameter of the wafer, said at least two smooth sloped annular band portions being configured such that a first of said portions is disposed near the end of said bar and a second of said portions is disposed a distance away from said first portion such that said band portions support said wafer between said at least two smooth sloped annular band portions.

14. A wafer processing chamber assembly as in claim 9, wherein said transfer finger support assembly includes a "C" shaped channel disposed to partially encircle the perimeter of a wafer to be processed, said channel being supported by a channel support assembly that is configured to move said "C" shaped channel up and down according to a vertical motion assembly of said transfer finger control mechanism.

15. A wafer processing chamber assembly as in claim 14, wherein said transfer fingers include a horizontal section attached to a set of finger support members each rotatable around its own rotational axis, said horizontal portion of each of said fingers each having a top end portion that has a beveled corner at its medial end, wherein when said fingers are disposed in a lifting configuration a wafer supported on said fingers touches said wafer only at locations along said beveled portion of said fingers, and when said fingers are moved to a retracted configuration said fingers and said transfer finger support assembly are clear of the path of said wafer and susceptor as the wafer and susceptor assembly moves past the transfer fingers of the transfer finger support assembly.

16. A wafer processing chamber assembly as in claim 15, wherein said rotational axis of each of said set of finger support members is generally vertical and centered along a finger shaft descending from and supported by said "C" shaped channel, each finger shaft having a crankarm offset from each of said rotational axes such that when a set of crankarm connection members is connected between crankarms of adjacent finger shafts, a generally axial movement of said crankarm connection member generally parallel to the central curved axis of the "C" shaped member will cause said crankarms at either end of said crankarm connection member to move thereby rotating the said connected finger shafts around their vertical axis.

17. A wafer processing chamber as in claim 16, wherein when an intermediate finger shaft is disposed between two finger shafts said intermediate shaft includes two crankarms disposed generally opposite from one another, such that a first crankarm connection member is connected between a first of said two crankarms and a crankarm of a finger shaft in a first direction along the curved axis of said "C" shaped channel and a second crankarm connection member is connected between a second of said two crankarms and a crankarm of a finger shaft in a second direction along the curved axis of said "C" shaped channel.

18. A wafer processing chamber as in claim 17, wherein said "C" shaped channel inside bottom surface is configured with a generally flat bottomed circular indentation approximately centered under said crankarm connection members and generally centrally located between adjacent finger shafts, said crankarm connection members having a generally flat surface facing said circular indentations;

wherein a bearing like ball is disposed in said circular indentation, said ball being sized and the depth of said indentation configured to allow said ball to roll freely in said indentation to act as a rolling bearing support between said inside bottom of said "C" shaped channel and the bottom of the crankarm connection members as the members move throughout their full range of travel, while keeping said crankarm connection members aligned between crankarms to reduce binding and excessive sliding friction when the crankarm connections are moved.

19. A wafer processing assembly as in claim 18, wherein said "C" shaped channel and said ball are constructed of a ceramic material.

20. A wafer processing chamber as in claim 16, wherein said "C" shaped channel inside bottom surface is configured with a generally flat bottomed circular indentation approximately centered under said crankarm connection members and generally centrally located between adjacent finger shafts, said crankarm connection members having a generally flat surface facing said circular indentations;

wherein a bearing like ball is disposed in said circular indentation, said ball being sized and the depth of said indentation configured to allow said ball to roll freely in said indentation to act as a rolling bearing support between said inside bottom of said "C" shaped channel and the bottom of the crankarm connection members as the members move throughout their full range of travel, while keeping said crankarm connection members aligned between crankarms to reduce binding and excessive sliding friction when the crankarm connections are moved.

21. A wafer processing assembly as in claim 20, wherein said "C" shaped channel and said ball are constructed of a ceramic material.

22. A wafer processing assembly as in claim 16, wherein said "C" shaped channel and said fingers are constructed of a ceramic material and said finger shafts are Haynes 242®.

23. A wafer processing assembly as in claim 15, wherein said "C" shaped channel and said fingers are constructed of a ceramic material.

24. A wafer processing chamber assembly as in claim 14, wherein said transfer fingers include a horizontal section attached to a set of finger support members each rotatable around its own rotational axis, wherein when said fingers are disposed in a lifting configuration a wafer supported on said fingers touches said wafer only at an edge of the wafer, and when said fingers are moved to a retracted configuration said fingers and said transfer finger support assembly are clear of the path of said wafer and susceptor as the wafer and susceptor assembly moves past the transfer fingers of the transfer finger support assembly;

wherein said rotational axis of each of said set of finger support members is generally vertical and centered along a finger shaft descending from and supported by said "C" shaped channel, each finger shaft having a crankarm offset from each of said rotational axes such that when a set of crankarm connection members is connected between crankarms of adjacent finger shafts, a generally axial movement of said crankarm connection member generally parallel to the central curved axis of the "C" shaped member will cause said crankarms at either end of said crankarm connection member to move thereby rotating the said connected finger shafts around their vertical axis;

wherein said "C" shaped channel inside bottom surface is configured with a generally flat bottomed circular indentation approximately centered under said crankarm connection members and generally centrally located between adjacent finger shafts, said crankarm connection members having a generally flat surface facing said circular indentations;

wherein a bearing like ball is disposed in said circular indentation, said ball being sized and the depth of said indentation configured to allow said ball to roll freely in said indentation to act as a rolling bearing support between said inside bottom of said "C" shaped channel and the bottom of the crankarm connection members as the members move throughout their full range of travel, while keeping said crankarm connection members aligned between crankarms to reduce binding and excessive sliding friction when the crankarm connections are moved.

25. A wafer processing assembly as in claim 24, wherein said "C" shaped channel and said ball are constructed of a ceramic material.

26. A wafer processing assembly as in claim 14, wherein said "C" shaped channel is constructed of a ceramic material.

27. A wafer processing assembly as in claim 14, wherein a shadow ring assembly is supported from and moves with said "C" shaped channel.

28. A wafer processing assembly as in claim 27, wherein said shadow ring assembly includes at least two rings, an inner ring supported by an outer ring.

29. A wafer processing chamber assembly as in claim 9, wherein said transfer fingers include a horizontal section attached to a set of finger support members each rotatable around its own rotational axis, said horizontal portion of each of said fingers each having a top end portion that has a beveled corner at its medial end, wherein when said fingers are disposed in a lifting configuration a wafer supported on said fingers touches said wafer only at locations along said beveled portion of said fingers, and when said fingers are moved to a retracted configuration said fingers and said transfer finger support assembly are clear of the path of said wafer and susceptor as the wafer and susceptor assembly moves past the transfer fingers of the transfer finger support assembly.

30. A face down susceptor comprising:

a generally flat plate having a front face, said face having a recess generally centered therein, a flat wafer perimeter face portion encircling said recess such that when a wafer is brought in contact with said face of said susceptor the circumferential edge of the wafer sealingly contacts said flat wafer perimeter face portion covering said recess, said recess including a generally uninterrupted cavity from its center to said perimeter face portion;

said recess including wafer support points rising from the bottom of said recess such that the top generally flat and parallel surfaces of all of said wafer support points form a flat plane coincident with the surface of the encircling perimeter face portion.

31. A face down susceptor as in claim 30, wherein apart from said wafer support points an inner surface of said recess includes a series of annular bands disposed at a depth from an imaginary plane formed by the bottom surfaces of the wafer support points and said flat wafer perimeter face portion, while generally uniform the recess depth of any band located at any position between the center of the susceptor and the inner edge of the flat perimeter face portion may vary from one depth to another depth according to a prescribed transition configuration.

32. A face down susceptor as in claim 31, wherein a vacuum passage is provided through said susceptor from a rear side of said susceptor to the front face of said susceptor opening to an inner surface of said recess.

33. A face down susceptor as in claim 32, wherein said recess depth at each location is proportional to and determines the heat transfer rate from the susceptor to the wafer associated with that location.

34. A face down susceptor as in claim 31, wherein said susceptor is supported by a hollow susceptor arm attached to the back of the face down susceptor, wherein a vacuum tube disposed within said susceptor arm provides a passage for vacuum pressure from a susceptor vacuum system through said vacuum passage to the back side of said susceptor.

35. A face down susceptor as in claim 34, wherein the wiring for a thermocouple disposed in the back of said susceptor is routed through said susceptor arm within said vacuum tube.

36. A robot blade comprising:

a bar having a width dimension, said bar having a recess formed therein in a top surface thereof at a location near the end of said bar, said recess includes a wafer edge support transition between an imaginary ring forming the bottom edge of said transition and an imaginary ring forming the top edge of said transition, wherein at least a portion of said transition is disposed at or above the bottom of said recess and said top edge of said transition is at or below the top of said bar;

said bar includes a set of at least two smooth sloped annular band portions configured to match an imaginary continuous sloped annular band having an inner circular boundary at the bottom edge of said transition having a first diameter and having an outer circular boundary at the top edge of said transition having a second diameter greater than said first diameter, said at least two smooth sloped annular band portions being configured such that a first of said portions is disposed near the end of said bar and a second of said portions is disposed a distance away from said first portion such that said band portions are configured to support a substrate between said at least two smooth sloped annular band portions.

37. A wafer processing assembly comprising:

an interfering ball;

a wafer transfer finger assembly having a generally vertical shaft, said shaft having an indentation slightly to receive a portion of, but not all of said ball, such that a portion of said ball protrudes a distance from said indentation beyond said shaft surface;

a generally horizontal transfer finger having a hole near one end which is sized to slip over said shaft such that said finger moves easily along said shaft, but does not pass by said ball when said ball is disposed in said shaft indentation, wherein said horizontal transfer finger hole includes a partial half round keyway in one side parallel to the hole axis at the bottom surface of said finger such that when said finger is slipped onto said shaft above said partial keyway and said ball is inserted protruding from said shaft said keyway contacts a the surface of said ball to capture it in said keyway and prevents the finger from sliding off the shaft and because the keyway is cut only part of the way through the thickness of the horizontal transfer finger, it prevents the finger from rotating separately from the shaft while contact with ball is maintained.

38. A wafer assembly as in claim 37, wherein said ball and finger are a ceramic material and said shaft is metal.

39. Apparatus for processing a substrate including a face for exposure to processing gases and a back side, the apparatus comprising:

(i) a reactor having wails defining a processing chamber; and (ii) handling means for handling the substrate inside the chamber, wherein the handling means includes (a) a substrate support having an engaging surface for engaging and supporting the back side of the substrate; and (b) means for applying a suction at the interface between the substrate support and the back side of the substrate, whereby, when the back side of the substrate is brought into engagement with the substrate support at a first substrate support position and the suction is applied, the substrate is drawn against and supported by the substrate support;

an access port communicating with the interior of the processing chamber; and insertion means for inserting the substrate into the processing chamber by way of the access port to Support the substrate at a second substrate support position wherein the substrate support is vertically movable from the first substrate support position through the second position and to a third position in which the substrate is processed.

40. Apparatus for processing a substrate as recited in claim 39 wherein said handling means further includes:

a "C" shaped member supporting a set of at least three transfer fingers; a transfer finger rotation mechanism supported by said "C" shaped member, to move said three transfer fingers from a lifting position to a retracted position;

wherein said "C" shaped member and fingers are configured to lift said substrate supported on said insertion means at said second substrate support position to said first substrate support position where said substrate is brought into engagement with the substrate support and means for applying a suction is engaged.

41. Apparatus for processing a substrate as recited in claim 40, wherein the substrate support substantially covers the back side of the substrate when the substrate is engaged by the supporting surface.

42. Apparatus for processing a substrate as recited in claim 41, further comprising heater means for heating the substrate.

43. Apparatus for processing a substrate as recited in claim 42, wherein the means for applying a suction includes at least one vacuum port formed in the substrate support to exit at the engaging surface whereby suction can be applied at the interface between the back side of the substrate and the engaging surface.

44. Apparatus for processing a substrate as recited in claim 43, wherein the means for applying suction further includes:

(i) a vacuum source for providing suction; and
   (ii) at least one conduit linking the vacuum source to the vacuum port formed in the substrate support.

45. Apparatus for processing a substrate as recited in claim 44, wherein the heater means heats the substrate support whereby heat is transferred from the substrate support to the substrate to heat the substrate.

46. Apparatus for processing a substrate as recited in claim 45, wherein the substrate support includes a substrate supporting surface in the form of a ring which, in use, engages the back side of the substrate.

47. Apparatus for processing a substrate as recited in claim 46, wherein the ring of supporting surface circumscribes an interior portion in the form of a generally flat land, the land having a plurality of protrusions located thereon, whereby, when the substrate is supported by the substrate support, the back side of the substrate is engaged by both the ring of supporting surface and the protrusions.

48. Apparatus for processing a substrate as recited in claim 47, wherein the protrusions present a substantially flat supporting profile to the back side of the substrate.

49. Apparatus for processing a substrate as recited in claim 48, wherein the insertion means includes:

(i) a generally flat member for carrying the substrate into and out of the chamber and having a middle portion flanked by a leading end and a following end; and
   (ii) at least one retainer formed at each of the leading and following ends of the member, each retainer having a substrate supporting face with a profile which slopes downwardly and inwardly toward the middle portion of the member, whereby, when the substrate is carried into and out of the chamber, it is supported at its outer edge by the supporting faces to be clear of the middle portion.

50. Apparatus for processing a substrate as recited in claim 49, wherein the supporting face of each retainer conforms to the outer edge of the substrate.

51. Apparatus for processing a substrate as recited in claim 44, wherein the engaging surface is flat said engaging surface engages the back side of the substrate whereby, when the substrate is drawn against and supported by the substrate support, the substrate is drawn flat against the engaging surface.

52. Apparatus for processing a substrate including a face for exposure to processing gases and a back side, the apparatus as in claim 39, wherein said substrate support includes a back surface covered with a ceramic plate having holes therein, such that changes in the number and size of holes in said ceramic plate affect the temperature and temperature distribution of said substrate support.

53. A method for handling a substrate within a substrate processing chamber formed within a substrate processing reactor, wherein the substrate includes a face for exposure to processing gases and a back side, the reactor further including an access port communicating with the interior of the processing chamber, the method comprising the steps of:

(i) locating the substrate within the processing reactor;
   (ii) providing substrate handling means having a downwardly facing substrate engaging surface;
   (iii) bringing the back side of the substrate into engagement with the substrate engaging surface; and
   (iv) applying a suction at the interface between the substrate engaging surface and the back side of the substrate, whereby the substrate is drawn against and supported by the handling means
   (v) inserting the substrate into the processing chamber by way of the access port
   (vi) moving the handling means vertically from a first position where the back side of the substrate is brought into engagement with the substrate engaging surface, through a second position from which the substrate is transferred into an out of the chamber, to a third position at which the substrate is processed.

54. A method for handling a substrate as recited in claim 53, further comprising the step of:

processing the substrate by passing reactant processing gasses across the face of the substrate.

55. A method for handling a substrate as recited in claim 54, further comprising the step of heating the substrate during the step of processing the substrate.

56. An apparatus for processing a substrate, comprising:

a "C" shaped member supporting a set of at least three transfer fingers;
   a transfer finger rotation mechanism supported by said member, to simultaneously move said three transfer fingers from a lifting position to a retracted position.

57. An apparatus for processing a substrate as in claim 56, wherein said "C" shaped member is a channel enclosing said transfer finger rotation mechanism.

58. An apparatus for processing a substrate as in claim 57, wherein said channel has an transverse open side between an inner "C" shaped wall and an outer "C" shaped wall enclosing said transfer finger rotation mechanism.

* * * * *